(12) United States Patent
Marotta et al.

(10) Patent No.: US 9,786,346 B2
(45) Date of Patent: Oct. 10, 2017

(54) VIRTUAL GROUND SENSING CIRCUITRY AND RELATED DEVICES, SYSTEMS, AND METHODS FOR CROSSPOINT FERROELECTRIC MEMORY

(71) Applicant: Micron Technology, Inc., Boise, ID (US)

(72) Inventors: Giulio Giuseppe Marotta, Contigliano (IT); Marco Domenico Tiburzi, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/717,471

(22) Filed: May 20, 2015

(65) Prior Publication Data

US 2016/0343422 A1    Nov. 24, 2016

(51) Int. Cl.
*G11C 11/22* (2006.01)
*G11C 11/56* (2006.01)

(52) U.S. Cl.
CPC ........ *G11C 11/2273* (2013.01); *G11C 11/221* (2013.01); *G11C 11/2253* (2013.01); *G11C 11/5657* (2013.01); *G11C 2213/77* (2013.01)

(58) Field of Classification Search
CPC ............ G11C 11/2273; G11C 11/2253; G11C 11/221
USPC .......................... 365/206, 207, 208, 204, 145
See application file for complete search history.

(56) References Cited

U.S. PATENT DOCUMENTS

| | | | |
|---|---|---|---|
| 5,530,668 A | 6/1996 | Chern et al. | |
| 6,529,398 B1 | 3/2003 | Nair et al. | |
| 6,856,534 B2 | 2/2005 | Rodriguez et al. | |
| 6,912,167 B2 | 6/2005 | Tam | |
| 6,975,530 B2 | 12/2005 | Takano | |
| 6,980,458 B2 | 12/2005 | Demange et al. | |

(Continued)

FOREIGN PATENT DOCUMENTS

WO    2011155951 A1    4/2004

OTHER PUBLICATIONS

Boscke et al., Ferroelectricity in Hafnium Oxide Thin Films, Applied Physics Letters, vol. 99, (2011), pp. 102903-102903-3.
(Continued)

*Primary Examiner* — Han Yang
*Assistant Examiner* — Jerome Leboeuf
(74) *Attorney, Agent, or Firm* — TraskBritt

(57) ABSTRACT

Virtual ground sensing circuits, electrical systems, computing devices, and related methods are disclosed. A virtual ground sensing circuit includes a sense circuit configured to compare a reference voltage potential to a sense node voltage potential, and virtual ground circuitry operably coupled to the sense circuit. The virtual ground circuitry is configured to provide a virtual ground at a first bias voltage potential to a conductive line operably coupled to a selected ferroelectric memory cell, and discharge the conductive line to the sense node responsive to the selected ferroelectric memory cell changing from a first polarization state to a second polarization state. A method includes applying a second bias voltage potential to another conductive line operably coupled to the selected ferroelectric memory cell, and comparing a sense node voltage potential to a reference voltage potential. Electrical systems and computing devices include virtual ground sensing circuits.

25 Claims, 11 Drawing Sheets

(56) References Cited

U.S. PATENT DOCUMENTS

| | | | |
|---|---|---|---|
| 7,113,437 B2* | 9/2006 | Schweickert | G11C 7/062 365/145 |
| 7,193,881 B2 | 3/2007 | Womack | |
| 7,869,252 B2 | 1/2011 | Koide | |
| 2001/0028587 A1 | 10/2001 | Kohno | |
| 2004/0062071 A1* | 4/2004 | Rodriguez | G11C 11/22 365/145 |
| 2004/0071018 A1 | 4/2004 | Nordal et al. | |
| 2004/0095823 A1* | 5/2004 | Tam | G11C 11/22 365/205 |
| 2004/0179414 A1* | 9/2004 | Hsu | G11C 7/04 365/211 |
| 2004/0240255 A1* | 12/2004 | Smith | G11C 11/16 365/158 |
| 2005/0024913 A1* | 2/2005 | Kang | G11C 11/22 365/145 |
| 2005/0201140 A1* | 9/2005 | Chow | G11C 11/22 365/145 |
| 2005/0254282 A1* | 11/2005 | Summerfelt | G11C 11/22 365/145 |
| 2016/0035406 A1* | 2/2016 | Johnson | G11C 11/2273 365/145 |

OTHER PUBLICATIONS

Evans et al., Toward Self-Assembled Ferroelectric Random Access Memories: Hard-Wired Switching Capacitor Arrays with Almost Tb/in.2 Densities, Nano Letters, vol. 7, No. 5, (2007), pp. 1134-1137.

Le, Binh Quang, Virtual-Ground Sensing Techniques for Fast, Low-Power, 1.8V Two-Bit-Per-Cell Flash Memories, Disseratation submitted to the Department of Electrical Engineering and the Committee on Graduate Studies of Stanford University in Partial Fulfillment of the Requirements for the Degree of Doctor of Philosophy, Nov. 2003, 144 pages.

Taiwan Office Action and Search Report for Taiwanese Application No. 105115583, dated Feb. 8, 2017, 17 page.

International Search Report for International Patent Application No. PCT/2016/031622, dated Aug. 19, 2016, 3 pages.

International Written Opinion for International Patent Application No. PCT/2016/031622, dated Aug. 19, 2016, 8 pages.

\* cited by examiner

VIRTUAL GROUND SENSING CIRCUITRY AND RELATED DEVICES, SYSTEMS, AND METHODS FOR CROSSPOINT FERROELECTRIC MEMORY

FIELD

The present disclosure relates generally to detecting charges stored in memory cells. More specifically, the present disclosure relates to detecting charges stored in ferroelectric memory cells, and to related circuits, devices, systems and methods.

BACKGROUND

Manufacturers of data storage devices continually seek to provide data storage devices with increased speed (e.g., faster read/write operations), lower power consumption, and higher memory capacity. Although many different kinds of data storage devices have been contemplated to date, NAND Flash memory, which typically includes arrays of floating gate transistors that store different charge levels corresponding to different digital bit states, remain prominent.

NAND Flash memory remains prominent despite other forms of data storage offering better speed, and lower power consumption (e.g., ferroelectric memory). This continued prominence of NAND Flash may be due in part to its relatively low cost of manufacturing, and relatively high storage density (i.e., relatively small memory cells), as compared to other forms of data storage.

BRIEF DESCRIPTION OF THE DRAWINGS

FIG. 2A illustrates a ferroelectric memory cell of the array of FIG. 1 operably coupled to a hypothetical variable voltage source;

FIG. 2B is a simplified plot showing the relationships of different voltages applied to the ferroelectric memory cell to different polarization states of the ferroelectric memory cell;

FIG. 6A is a schematic view of a sense circuit in a multi-level polarization scheme;

FIG. 6B illustrates plots of voltage potentials of the sense circuit of FIG. 6A;

FIG. 7A is a schematic view of a sense circuit in a multi-level polarization scheme;

FIG. 7B illustrates plots of voltage potentials of the sense circuit of FIG. 7A;

DETAILED DESCRIPTION

Figure 1:
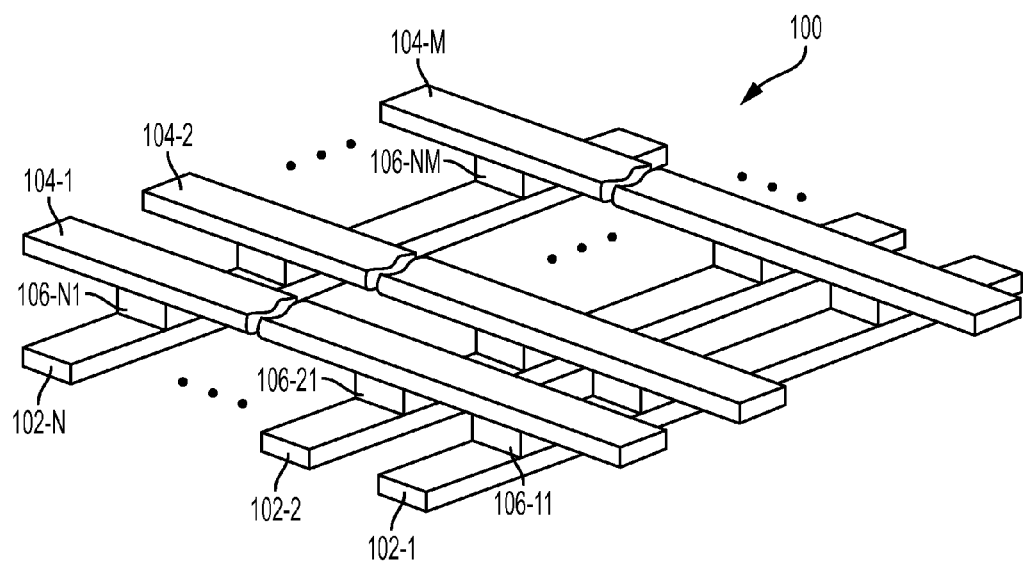
FIG. 1 is a simplified diagram of a portion of an array of ferroelectric memory cells according to embodiments of the present disclosure.

In the following detailed description, reference is made to the accompanying drawings which form a part hereof, and in which is shown by way of illustration specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system.

Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be rearranged. A process may correspond to a method, a function, a procedure, a subroutine, a subprogram, etc. Furthermore, the methods disclosed herein may be implemented in hardware, software, or both. If implemented in software, the functions may be stored or transmitted as one or more computer-readable instructions (e.g., software code) on a computer-readable medium. Computer-readable media may include both computer storage media and communication media including any medium that facilitates transfer of a computer program from one place to another. Computer-readable media may include volatile and non-volatile memory, such as, for example, magnetic and optical storage devices, such as, for example, hard drives, disk drives, magnetic tapes, CDs (compact discs), DVDs (digital versatile discs or digital video discs), solid state storage devices (solid state drives), and other similar storage devices.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 106) and specifically indicated by the numerical indicator followed by a numeric indicator preceded by a "dash" (e.g., 106-11). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 3 will be mostly in the numerical format 3xx.

Virtual ground sensing circuits disclosed herein may be configured to perform sense operations by discharging a conductive line operably coupled to a selected memory cell to a sense node having a sense node capacitance less than a capacitance of the conductive line. Although the present disclosure is discussed primarily with reference to ferroelectric memory, the systems and methods of the present disclosure may be implemented in any environment where sensing relatively small charges and voltage potentials may be helpful or desirable.

As used herein, the term "ferroelectric material" refers to materials that demonstrate non-linear polarization in two or more polarization levels responsive to different voltage potentials being applied across the materials. By way of non-limiting example, ferroelectric materials may include lead zirconate titanate (PZT), strontium bismuth tantalite (SBT), bismuth lanthanum titanate (BLT), lead titanate, barium titanate, and hafnium dioxide ($HfO_2$). As used herein, the term "polarization levels" refers to different magnitudes and orientations (e.g., directions) of polarization e.g., forward and reverse polarizations in response to applied forward and reverse voltage potentials, respectively). In some embodiments, different polarization levels may also be subdivided into different energy levels of polarization (i.e., multi-level charge injection) within the same orientation of polarization (enabling multiple bits to be stored to the same ferroelectric memory cell). Multilevel charge injection of ferroelectric materials may be used to manufacture multi-bit ferroelectric memory cells. For example, multi-bit ferroelectric memory cells are disclosed in U.S. Pat. No. 6,856,534 to Rodriguez et al., the entire disclosure of which is hereby incorporated herein by this reference.

As used herein, the term "ferroelectric memory cell" refers to a memory cell that includes a ferroelectric material. Different polarization levels of the ferroelectric material may correspond to different data bits (e.g., a positive polarization may correspond to a logic "1," and a negative polarization may correspond to a logic "0", or vice versa). The polarization of the ferroelectric material may be controlled and read by applying specific voltage potentials across the ferromagnetic material, as will be discussed in more detail herein. Although ferroelectric memory cells including ferroelectric field effect transistors (FeFETs) are known in the art, as used herein, the term "ferroelectric memory cell" refers specifically to a ferroelectric memory cell including a ferroelectric capacitor (i.e., a ferroelectric material between two conductive electrodes).

As used herein, the term "virtual ground" refers to a node of an electrical circuit that is held at a reference voltage potential, but that is not operably coupled directly to that reference voltage potential. Accordingly, a voltage potential of a virtual ground may temporarily fluctuate (i.e., as transients are applied to the virtual ground), but return to the reference voltage potential in the steady state.

As used herein, the term "charge" refers to a measure of electrical charge, commonly measured in Coulombs (C). The term "charge" does not herein refer specifically to charge carriers (e.g., electrons, holes). Accordingly, as used herein, terms relating to the phrases "emitting a charge" and "sinking a charge" are used with reference to changes in positive charge as measured in Coulombs, not specifically to an emission or sinking of a particular charge carrier.

FIG. 1 is a simplified diagram of a portion of an array 100 of ferroelectric memory cells 106 according to embodiments of the present disclosure. In the example illustrated in FIG. 1, the array 100 is a cross-point array having ferroelectric memory cells 106 located at the intersections of a first number of conductive lines 104-1, 104-2, . . . , 104-M (e.g., access lines, which may also be referred to herein as word lines 104), and a second number of conductive lines 102-1, 102-2, . . . , 102-N (e.g., data sense lines, which may also be referred to herein as bit lines 102). Each ferroelectric memory cell 106 may include a ferroelectric capacitor including ferroelectric material coupled between two conductive electrodes (e.g., a word line 104 and a bit line 102). As illustrated in FIG. 1, the word lines 104 may be substantially parallel to each other and substantially orthogonal to the bit lines 102, which may be substantially parallel to each other; however, embodiments are not so limited. In the embodiment illustrated in FIG. 1, the ferroelectric memory cells 106 (e.g., 106-11, 106-21, 106-N1, and 106-NM) can function in a two-terminal architecture with a particular word line 104 and a particular bit line 102 serving as a top electrode and bottom electrode, respectively, for the ferroelectric memory cell 106. Although in FIG. 1 the array is illustrated in an orientation with bit lines 102 on the bottom, ferroelectric memory cells 106 in the middle, and word lines 104 on top, other orientations are also contemplated. For example, an orientation is contemplated where word lines 104 are on the bottom, ferroelectric memory cells 106 are in the middle, and bit lines 102 are on the top. Also, sideways orientations are contemplated. Furthermore, three-dimensional arrays of ferroelectric memory cells 106 in a variety of orientations are contemplated (e.g., multiple tiers of arrays similar to the array 100 of FIG. 1, using pillar structures such as those used in three-dimensional NAND memory, etc.) Any orientation having ferroelectric memory cells 106 between bit lines 102 and word lines 104 are contemplated within the scope of the disclosure.

It is noted that the structure of the array 100 is relatively simple, and scaling of the array 100 may be subject essentially to the limits of lithography. Accordingly, it may be possible to manufacture the array 100 with relatively small ferroelectric memory cells 106.

It is also contemplated within the scope of the disclosure that switching elements (not shown) (e.g., access transistors activated by additional conductive lines, non-ohmic-devices (NODs) in series with the ferroelectric memory cells 106, etc.) may be placed between the ferroelectric memory cells 106 and at least one of the bit lines 102 and the word lines 104. In some embodiments, these switching elements are not included, as will be discussed in more detail with respect to an example of a portion 300 of the array 100 with reference to FIG. 3.

In operation, the ferroelectric memory cells 106 of the array 100 can be programmed via programming signals (e.g., write voltage potentials) applied to the ferroelectric memory cells 106 (e.g., the ferroelectric material of the cells) via selected word lines 104, bit lines 102, other suitable signals coupled to the ferroelectric memory cells 106, and combinations thereof. The amplitude, shape, duration, and/or number of programming pulses, for example, applied to the ferroelectric memory cells 106 can be adjusted (e.g., varied) in order to program the ferroelectric material of the ferroelectric memory cells 106 to one of a number of different polarization levels corresponding to particular data states.

In some embodiments, an electrical system includes an array of memory cells, each memory cell in the array of memory cells includes a first electrode and a second electrode. Each memory cell in the array of memory cells is configured to transition from a first data state to a second data state when a critical voltage potential is applied across the first electrode and the second electrode. The electrical system also includes control circuitry operably coupled to the array of memory cells. The control circuitry includes biasing circuitry configured to apply the critical voltage potential to a selected memory cell of the array of memory cells by providing a first bias voltage potential to the first electrode of the selected memory cell and a second bias voltage potential to the second electrode of the selected memory cell. The control circuitry also includes a virtual ground sensing circuit operably coupled between the biasing circuitry and the second electrode. The virtual ground sensing circuitry is configured to relay the second bias voltage potential from the biasing circuitry to the second electrode, and serve as a virtual ground operably coupled to the second electrode. The virtual ground sensing circuitry is also configured to discharge the second electrode to a sense node if the memory cell transitions from the first data state to the second data state. The virtual ground sensing circuitry is further configured to compare a sense node voltage potential of the sense node to a reference voltage potential to determine a data state the selected memory cell was in. In some embodiments, the at least a portion of the memory cells of the array of memory cells includes a ferroelectric material between the first electrode and the second electrode. In some embodiments, the ferroelectric material comprises at least one material selected from the group consisting of lead zirconate titanate (PZT), strontium bismuth tantalite (SBT), bismuth lanthanum titanate (BLT), lead titanate, barium titanate, and hafnium dioxide ($HfO_2$).

Figure 2A:
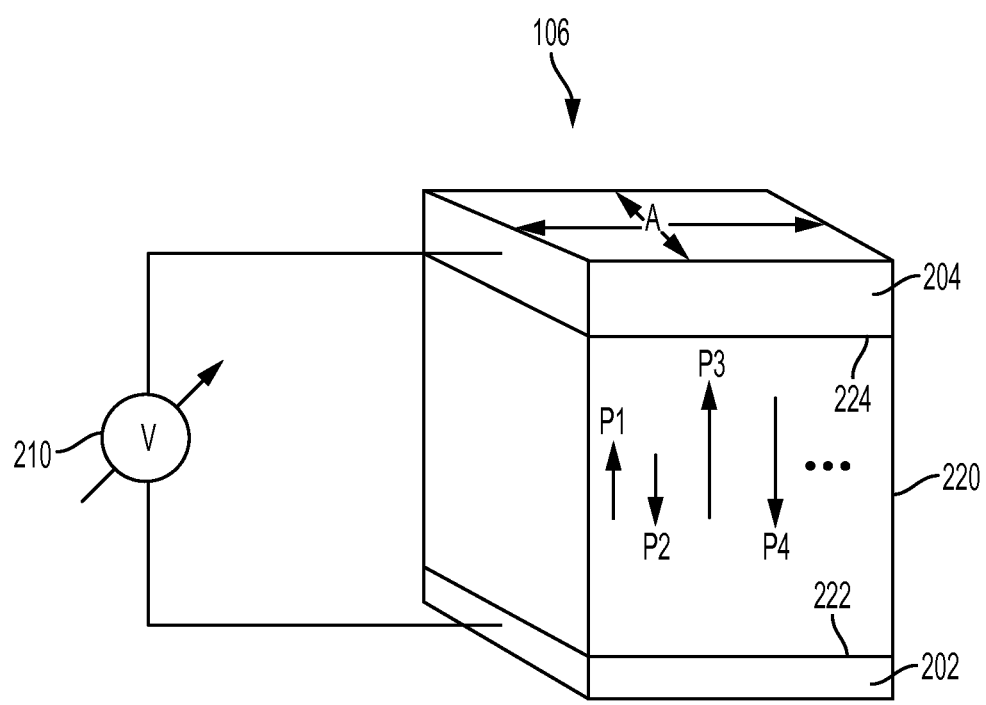
FIGS. 2A and 2B illustrate relationships between different voltage potentials applied to a ferroelectric memory cell of the array of FIG. 1 and corresponding polarization states of the ferroelectric memory cell 106.
Figure 2B:
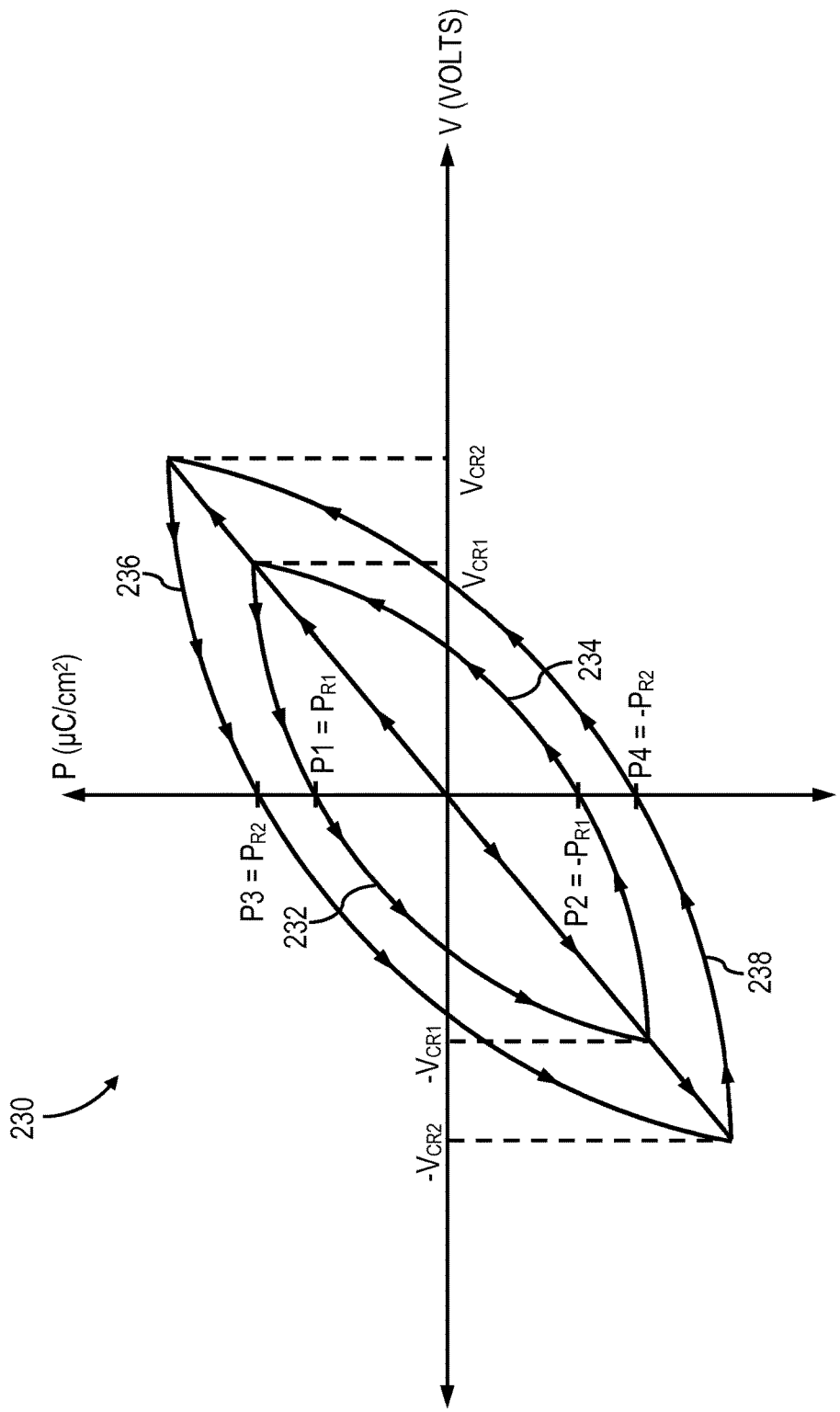

FIGS. 2A and 2B illustrate relationships between different voltage potentials applied to a ferroelectric memory cell 106 of the array 100 of FIG. 1 and corresponding polarization states P1, P2, P3, P4, etc., of the ferroelectric memory cell 106. FIG. 2A illustrates the ferroelectric memory cell 106 of the array 100 of FIG. 1 operably coupled to a hypothetical variable voltage source 210. FIG. 2B is a simplified plot 230 showing the relationships of different voltages applied to the ferroelectric memory cell 106 to different polarization states P1, P2, P3, P4, etc., of the ferroelectric memory cell 106. As used herein, the term "polarization state" and "polarization states," identify different polarization levels without making explicit the magnitude (e.g., $P_{R1}$, $P_{R2}$) and orientation (e.g., +, −) of the corresponding polarization level (e.g., to simplify references to the various polarization levels). For non-limiting examples expressed herein, polarization states P1, P2, P3, and P4 correspond to polarization levels $P_{R1}$, $-P_{R1}$, $P_{R2}$, $-P_{R2}$, respectively.

Referring to FIGS. 2A and 2B together, the ferroelectric memory cell 106 may include a ferroelectric material 220 having a first side 222, and a second side 224 opposite the first side 222. The ferroelectric material 220 may have an area A taken substantially parallel to the first and second sides 222, 224.

The ferroelectric material 220 may be configurable in a number of different polarization states P1, P2, P3, P4, etc. Polarization levels corresponding to the different polarization states P1, P2, P3, P4, etc., may be differentiated from each other by at least one of orientation (sometimes expressed as positive + and negative −) and magnitude (sometimes expressed in $\mu C/cm^2$). By way of non-limiting example, a polarization state P1 of the ferroelectric material 220 may correspond to a polarization level having an orientation pointing from the first side 222 to the second side 224 (hereinafter referred to as a "positive orientation," or a "positive polarization"), and a relatively small magnitude (e.g., $+P_{R1}$, a residual polarization according to a first charge injection level). A polarization state P2 may correspond to a polarization level having an orientation pointing from the second electrode 204 to first electrode 202 (hereinafter referred to as a "negative orientation," or a "negative polarization"), and relatively small magnitude (e.g., $-P_{R1}$). A polarization P3 may correspond to a polarization level having a positive polarization and a relatively larger magnitude (e.g., $+P_{R2}$, a residual polarization according to a second charge injection level). A polarization P4 may correspond to a polarization level having a negative polarization, and relatively larger magnitude (e.g., $-P_{R2}$). In some embodiments, more polarization states may exist. By way of non-limiting example, polarization levels having positive and negative orientations, and even larger magnitude than polarization level $P_{R2}$ are contemplated.

The ferroelectric memory cell 106 may also include a first electrode 202 operably coupled to the first side 222 of the ferroelectric material 220, and a second electrode 204 operably coupled to the second side 224 of the ferroelectric material 220. The first and second electrodes 202, 204 may include conductive material. In some embodiments, the bit line 102 and the word line 104 of the array 100 (FIG. 1) may include the first and second electrodes 202, 204, respectively. In such embodiments, the ferroelectric memory cell 106 may include the ferroelectric material 220 between the bit line 102 and the word line 104. In some embodiments, the first electrode 202 and the second electrode 204 may include conductive structures in addition to the bit line 102 and the word line 104, configured to operably couple the ferroelectric material 220 to the bit line 102 and the word line 104, respectively.

As illustrated in FIG. 2A, bias voltages may be applied to the first and second electrodes 202, 204. By way of non-limiting example, a hypothetical variable voltage source 210 may be operably coupled to the first and second electrodes 202, 204 of the ferroelectric memory cell 106. The plot 230 of FIG. 2B illustrates an ascending curve 234 and a descending curve 232 of the polarization P of the ferroelectric material 220 as a voltage V of the hypothetical variable voltage source 210 is swept from low to high, and from high to low, respectively, according to a first level of charge injection (i.e., voltage V is swept from a low voltage greater than critical voltage $-V_{CR2}$ and less than or equal to critical voltage $-V_{CR1}$ to a high voltage greater than or equal to critical voltage $V_{CR1}$ and less than critical voltage $V_{CR2}$). The plot 230 also illustrates an ascending curve 238 and a descending curve 236 of the polarization P of the ferroelectric material 220 as a voltage V of the hypothetical variable voltage source 210 is swept from low to high, and from high to low, respectively, according to a second level of charge injection (i.e., voltage V is swept from a low voltage less than or equal to critical voltage $-V_{CR2}$ to a high voltage greater than or equal to $V_{CR2}$.

Critical voltage $V_{CR1}$ may be a voltage potential that is required to switch the ferroelectric material 220 from polarization states P2 and P4 to polarization state P1. Critical voltage $-V_{CR1}$ may be a voltage potential that is required to switch the ferroelectric material 220 from polarization states P1 and P3 to polarization state P2. Critical voltage $V_{CR2}$ may be a voltage potential that is required to switch the ferroelectric material 220 from polarization states P1, P2, and P4 to polarization state P3. Similarly, critical voltage $-V_{CR2}$ may be a voltage potential that is required to switch the ferroelectric material 220 from polarization states P1, P2, and P3 to polarization state P4. In general, as used herein, the term "critical voltage," refers to a voltage potential that, when applied to the ferroelectric memory cell 106, causes the ferroelectric material 220 of the ferroelectric memory cell 106 to change from one polarization state to another polarization state.

As is apparent from the plot 230, it is possible for the ferroelectric material 220 to be polarized to any of several different polarization states P1, P2, P3, and P4 (e.g., corresponding to polarization levels $+P_{R1}$, $-P_{R1}$, $+P_{R2}$, and $-P_{R2}$) when bias voltages are released from the ferroelectric material 220 (i.e., zero volts is applied to the ferroelectric material 220), depending on previous bias voltage potentials applied to the ferroelectric material 220. For example, following an application of critical voltage $V_{CR2}$ to the ferroelectric material 220, when the critical voltage $V_{CR2}$ is removed, and the voltage potential across the ferroelectric material 220 returns to zero, the polarization state of the ferroelectric material 220 may be P3 (corresponding to polarization level $+P_{R2}$). This dependence upon past biases of the ferroelectric material 220 is known as "hysteresis."

As is apparent from the plot 230, the ferroelectric material 220 exhibits residual polarization, or non-zero polarization level that remains after voltage potentials applied thereto are removed (i.e., switched to zero). Polarization states P1, P2, P3, and P4 may correspond to residual polarizations $+P_{R1}$, $-P_{R1}$, $+P_{R2}$, and $-P_{R2}$ of the ferroelectric material 220. In general, ferroelectric materials often have a constant known as a "residual polarization" $P_R$ associated therewith. The residual polarization $P_R$ of the ferroelectric material 220 may be the magnitude of P1 (i.e., $+P_{R1}$), in some instances. The residual polarization $P_R$ (and the different polarization states P1, P2, P3, and P4) may be different for different ferroelectric materials. By way of non-limiting example, the residual polarization $P_R$ of PZT, SBT, and BLT may respectively be 25, 10, and 15 micro-Coulombs per square centimeter ($\rho C/cm^2$).

In some embodiments, a single level ferroelectric memory cell 106 may be programmed to one of two polarization states P1, P2 (e.g., $+P_{R1}$, $-P_{R1}$), corresponding to a logic 1 and a logic 0 (or vice versa), respectively. By way of non-limiting example, The ferroelectric memory cell 106 may be programmed with critical voltage $V_{CR1}$, which will place the ferroelectric memory cell 106 in polarization state P1 (and the corresponding data state) when the critical voltage $V_{CR1}$ is removed, or the ferroelectric memory cell 106 may be programmed with a critical voltage $-V_{CR1}$, which will place the ferroelectric memory cell 106 in polarization state P2 (and the corresponding data state) when the critical voltage $-V_{CR1}$ is removed.

In some embodiments, a multi-level ferroelectric memory cell 106 may be programmed to one of four or more polarization states P1, P2, P3, P4, etc., corresponding to four or more data states (e.g., digital data states 00, 01, 10, 11, etc.). The ferroelectric memory cell 106 may be programmed with any of several different critical voltages $V_{CR1}$, $-V_{CR1}$, $V_{CR2}$, $-V_{CR2}$, etc., which will place the ferroelectric memory cell 106 in a corresponding one of the polarization states P1, P2, P3, P4, etc. (and the corresponding data states), when the corresponding critical voltage $V_{CR1}$, $-V_{CR1}$, $V_{CR2}$, $-V_{CR2}$, etc., is removed. It should be noted that applying critical voltage $V_{CR1}$ to a ferroelectric memory cell 106 in a P3 polarization state may not switch the ferroelectric memory cell 106 to the P1 state, and applying critical voltage $-V_{CR1}$ to a ferroelectric memory cell 106 in a P4 polarization state may not switch the ferroelectric memory cell 106 to the P2 state.

A different amount of charge may be held by the ferroelectric memory cell 106 depending, at least in part, on the polarization state P1, P2, P3, P4, etc., of the ferroelectric memory cell 106. Accordingly, charge is emitted from or sinked to the ferroelectric memory cell 106 through at least one of the first and second electrodes 202, 204 when the ferroelectric memory cell 106 switches between the different polarization states P1, P2, P3, P4, etc. In the case where polarization states P1 and P2 are selected to coincide with $+P_{R1}$ and $-P_{R1}$, respectively, the difference in charge held by the ferroelectric memory cell 106 in polarization state P1 and polarization state P2 is:

$$\Delta Q = 2(A)(P_{R1}).$$

Thus, it follows that when the ferroelectric memory cell 106 switches from polarization state P2 to polarization state P1, the ferroelectric memory cell 106 sinks positive charge with magnitude $2(A)(P_{R1})$. Also, when the ferroelectric memory cell 106 switches from polarization state P1 to polarization state P2, the ferroelectric memory cell 106 emits positive charge with magnitude $2(A)(P_{R1})$. Similarly, charge proportional to the differences between polarization states P1, P2, P3, P4, etc., may be emitted or sinked when switching between the polarization states P1, P2, P3, P4, etc. (e.g., charge is sinked when switching from P1 to P3, from P4 to P1, from P4 to P3, and from P2 to P3; and charge is emitted when switching from P2 to P4, from P3 to P2, from P3 to P4, and from P1 to P3). Therefore, it is possible to determine a polarization state P of the ferroelectric memory cell 106 if a known critical voltage $V_{CR1}$, $-V_{CR1}$, $V_{CR2}$, $-V_{CR2}$, etc., is applied to the ferroelectric memory cell 106, and charge emitted from or sinked to the ferroelectric memory cell 106 (or lack of charge emitting from or sinking to the ferroelectric memory cell 106) is measured. It should be noted that since switching from P4 to P2, and from P3 to P1 may not be readily performed by applying the respective critical voltages $V_{CR2}$ and $V_{CR1}$, it may be helpful to apply either $V_{CR2}$ or $-V_{CR2}$ to the ferroelectric memory cell 106 to determine which of the polarization states P1, P2, P3, P4 the ferroelectric memory cell 106 is in if a multi-level scheme is used.

A sense operation (e.g., a read operation), therefore, may be used to determine the polarization state P (and by extension, the corresponding data state) of the ferroelectric memory cell 106. The sensing operation may include applying a critical voltage $V_{CR1}$, $-V_{CR1}$, $V_{CR2}$, $-V_{CR2}$, etc., to the ferroelectric memory cell 106 (destroying the data stored on the ferroelectric memory cell 106). The sense operation may also include sensing charge emitted to/sinked from the ferroelectric memory cell 106 (e.g., to one of the bit line 102 and the word line 104) while applying the critical voltage $V_{CR1}$, $-V_{CR1}$, $V_{CR2}$, $-V_{CR2}$ to the ferroelectric memory cell 106. If the information stored in the ferroelectric memory cell 106 is desired to persist past the sense operation, the critical voltage corresponding to the sensed polarization state may be re-applied to the sensed ferroelectric memory cell 106 (unless the critical voltage used to perform the sense operation corresponds to the sensed polarization state, in which case the sensed ferroelectric memory cell 106 will already be in the appropriate polarization state).

The magnitude of charge emitted from or sinked to the ferroelectric memory cell 106 when the ferroelectric memory cell 106 switches from one polarization state to another polarization state is proportional to the area A of the ferroelectric memory cell 106. A market demand for continually higher and higher density memory cell arrays (and correspondingly smaller and smaller memory cell areas) suggests that all other things being equal, the area A of the ferroelectric memory cell 106 should preferably be as small as possible. Since the magnitude of charge emitted from or sinked to the ferroelectric memory cell 106 is proportional to the area A, which is preferably selected to be relatively small, the magnitude of the charge emitted or sinked may likewise be relatively small.

A change in voltage on one of the bit line 102 and the word line 104 responsive to the polarization switch is proportional to the charge emitted from or sinked to the ferroelectric memory cell 106 (i.e., $\Delta V=\Delta Q/C$, where $\Delta V$ is the change in voltage, $\Delta Q$ is the change in charge, and C is the capacitance of the conductive line (e.g., the bit line 102 or the word line 104) that receives/provides the charge). Assuming that the capacitance of the conductive line 102, 104 (C) is about a picoFarad (pF), the residual polarization $P_R$ is about 25 $\mu C/cm^2$, and the area A of the ferroelectric memory cell 106 is about 100 $nm^2$, switching between polarization states P1 and P2 would result in a change in voltage $\Delta V$ of only about 50 microvolts ($\mu V$) on the conductive line 102, 104. Virtual ground sensing circuitry 500 that may be capable of detecting the relatively small change in voltage will be discussed below with reference to FIGS. 4 through 7B.

Figure 3:
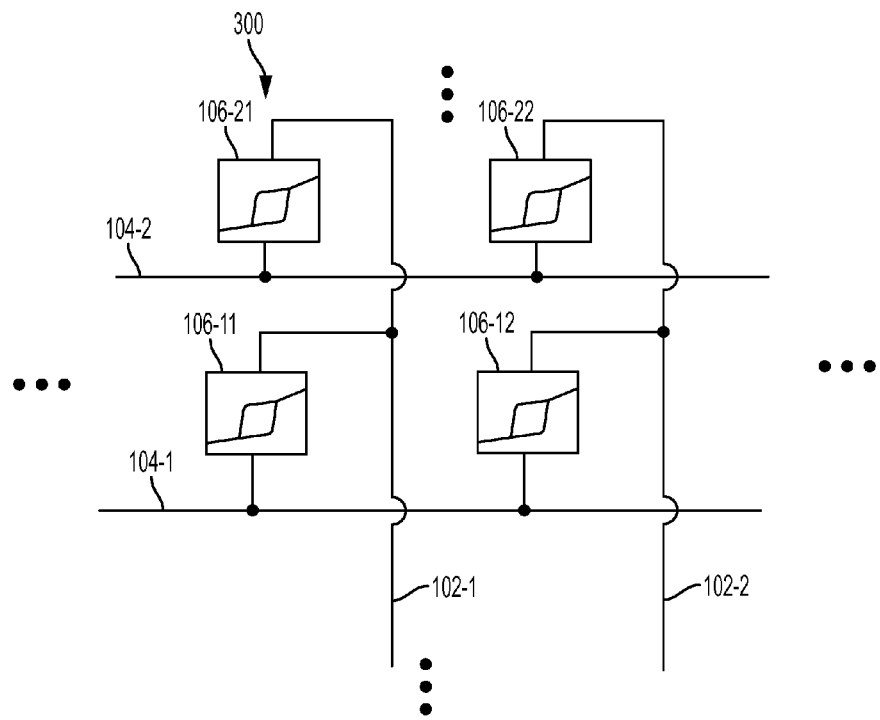
FIG. 3 is a simplified schematic view of a portion of the array of FIG. 1, according to embodiments of the disclosure.

FIG. 3 is a simplified schematic view of a portion 300 of the array 100 of FIG. 1, according to some embodiments of the disclosure. In these embodiments, it is assumed that a single-level polarization scheme is used (e.g., each memory cell 106 stores a single bit with a logic level 1 assigned to a polarization state P1 (i.e., $+P_{R1}$), and a logic level 0 is assigned to a polarization state P2 (i.e., $-P_{R1}$), or vice versa). Access switches (e.g., access transistors) may be needed in multi-level polarization schemes. The portion 300 of the array 100 may include ferroelectric memory cells 106-11, 106-21, 106-12, 106-22 (sometimes referred to generally individually as "ferroelectric memory cell" 106 and together as "ferroelectric memory cells" 106) operably coupled between bit lines 102-1, 102-2 (sometimes referred to generally individually as "bit line" 102 and together as "bit lines" 102) and word lines 104-1, 104-2 (sometimes referred to generally individually as "word line" 104 and together as "word lines" 104). Bias voltages (e.g., critical voltages) may be applied to the bit lines 102 and the word lines 104 to access (e.g., sense, set, reset) the ferroelectric memory cells 106. One or more of the ferroelectric memory cells 106 may be selected for accessing at a time.

By way of non-limiting example, ferroelectric memory cell 106-21 may be selected and reset to the polarization state P2 (FIGS. 2A and 2B). A first bias voltage potential (VG+$V_{CR1}$/2) equal to a virtual ground potential (VG) minus half of critical voltage $-V_{CR1}$ (FIGS. 2A and 2B) may be applied to bit line 102-1. A second bias voltage potential (VG-$V_{CR1}$/2) equal to the virtual ground potential (VG) plus half of the critical voltage $-V_{CR1}$ may be applied to word line 104-2. As a result, a total of $-V_{CR1}$ (the critical voltage $-V_{CR1}$) may be applied across the ferroelectric memory cell 106-21. The virtual ground voltage VG may be applied to bit line 102-2 and word line 104-1. Accordingly, although voltage potentials having magnitudes equal to half the critical voltage $-V_{CR1}$ are applied to unselected memory cells 106-11 and 106-22, half the critical voltage $-V_{CR1}$ is not sufficient to change the polarization state of the unselected memory cells 106-11 and 106-22. A voltage applied across unselected memory cell 106-12 may be about zero volts, which is also insufficient to switch the memory cell 106-12 away from either the P1 or P2 polarization state. Thus, access transistors may not be needed in this embodiment.

Also by way of non-limiting example, ferroelectric memory cell 106-21 may be selected and set to the polarization state P1 (FIGS. 2A and 2B) in a write operation, or in a sense operation. It should be noted that because sense operations in this embodiment place the memory cell 106-21 into the polarization state P1, after a sense operation, the memory cell 106-21 may need to be reset to the polarization state P2 if it is detected that the memory cell 106-21 was in the polarization state P2 in order to preserve the data stored in the memory cell 106-21. A first bias voltage potential (VG-$V_{CR1}$/2) equal to the virtual ground potential VG minus half of critical voltage $V_{CR1}$ (FIGS. 2A and 2B) may be applied to bit line 102-1. A second bias voltage potential (VG+$V_{CR1}$/2) equal to the virtual ground potential (VG) plus half of the critical voltage $V_{CR1}$ may be applied to word line 104-2. As a result, a total of $V_{CR1}$ (the critical voltage $V_{CR1}$) may be applied across the ferroelectric memory cell 106-21. The virtual ground voltage VG may be applied to bit line 102-2 and word line 104-1. Accordingly, although voltage potentials having magnitudes equal to half the critical voltage $V_{CR1}$ are applied to unselected memory cells 106-11 and 106-22, half the critical voltage $V_{CR1}$ is not sufficient to change the polarization state of the unselected memory cells 106-11 and 106-22. Also, a voltage applied across unselected memory cell 106-12 may be about zero volts, which is also insufficient to switch the memory cell 106-12 away from either the P1 or P2 polarization state.

While the examples discussed above with reference to FIG. 3 refer to selecting and accessing ferroelectric memory cell 106-21, the other ferroelectric memory cells 106-11, 106-12, 106-22 may similarly be selected and accessed. Also, all the ferroelectric memory cells 106 may be selected and accessed simultaneously (e.g., during a reset operation of all the ferroelectric memory cells 106). For example, a first bias voltage (VG−$V_{CR}$/2) equal to the virtual ground voltage VG minus half of one of the critical voltages $V_{CR1}$, −$V_{CR1}$ may be applied to both bit lines 102-1, 102-2, and a second bias voltage (VG+$V_{CR}$/2) equal to the virtual ground voltage VG plus half of the one of the critical voltages $V_{CR1}$, −$V_{CR1}$ may be applied to both word lines 104-1, 104-2. As a result the one of the critical voltages $V_{CR1}$, −$V_{CR1}$ may be applied to each of the ferroelectric memory cells 106. It should be apparent to those of ordinary skill in the art how to similarly select and access individual ferroelectric memory cells 106, subgroups of ferroelectric memory cells 106, and all ferroelectric memory cells in a full array 100 using similar techniques.

Figure 4:
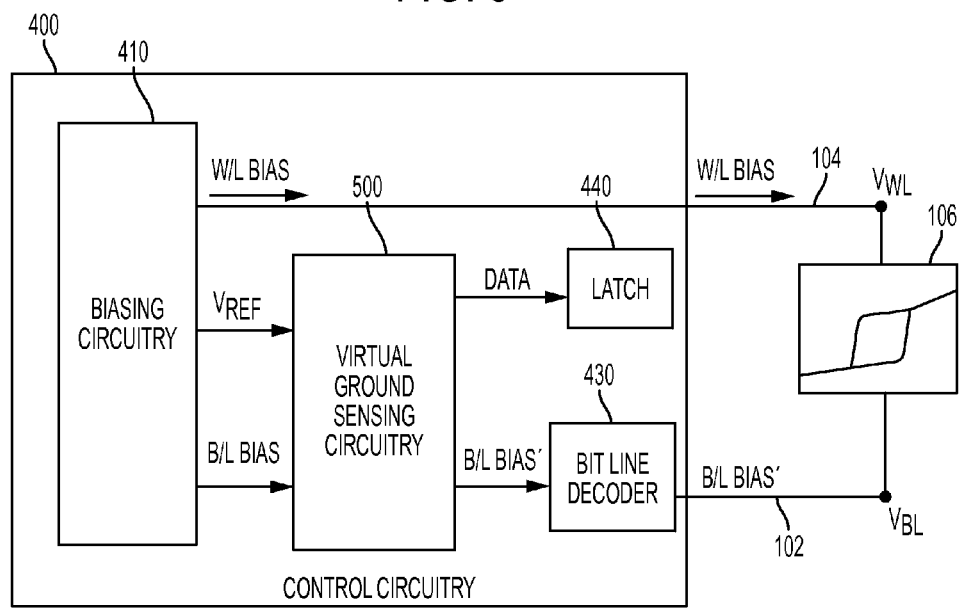
FIG. 4 is a simplified block diagram of control circuitry operably coupled to one of the ferroelectric memory cells of the array of FIG. 1.

FIG. 4 is a simplified block diagram of control circuitry 400 operably coupled to one of the ferroelectric memory cells 106 of the array 100 of FIG. 1. The control circuitry 400 may be configured to access the ferroelectric memory cell 106. The control circuitry 400 may include biasing circuitry 410, virtual ground sensing circuitry 500, and a bit line decoder 430. In some embodiments, the control circuitry 400 may include a word line decoder (not shown) instead of, or in addition to, the bit line decoder 430.

The biasing circuitry 410 may be configured to provide bias voltage potentials for biasing the bit lines 102 and the word lines 104 of the array 100 (FIG. 1). For example, the biasing circuitry 410 may be configured to provide a word line bias voltage potential W/L BIAS and a bit line bias voltage potential B/L BIAS. W/L BIAS and B/L BIAS may be selected to enable the virtual ground sensing circuitry 500 to access the ferroelectric memory cell 106 (e.g., perform sense, set, and reset operations as previously discussed). By way of non-limiting example, W/L BIAS and B/L BIAS may be selected to apply the various critical voltages $V_{CR1}$, −$V_{CR1}$, $V_{CR2}$, −$V_{CR2}$ to the ferroelectric memory cell 106.

The biasing circuitry 410 may also be configured to provide reference voltage potentials $V_{REF}$ to the virtual ground sensing circuitry 500. The virtual ground sensing circuitry 500 may use the reference voltage potentials $V_{REF}$ in sense operations to detect charge sinked to or emitted from the ferroelectric memory cell 106. By way of non-limiting example, the virtual ground sensing circuitry 500 may compare the reference voltage potentials $V_{REF}$ to changes in voltage potentials that occur when the ferroelectric memory cell 106 sinks and/or emits charge during sense operations. The virtual ground sensing circuitry 500 may output data signals DATA (latch 440) indicating a data state corresponding to a sensed polarization state of the ferroelectric memory cell 106.

The virtual ground sensing circuitry 500 may also be configured to provide a virtual ground at a voltage potential B/L BIAS' equal to the bit line bias voltage potential B/L BIAS to the bit line 102 (e.g., through the bit line decoder 430). In other words, the virtual ground sensing circuitry 500 may be configured to relay the bit line bias voltage potential B/L BIAS to the bit line 102. The virtual ground sensing circuitry 500 may be configured to discharge the bit line 102 to a sense node when charge is sinked to/emitted from the ferroelectric memory cell 106. The sense node may have a sense node capacitance less than a capacitance of the bit line 102. Although FIG. 4 illustrates the virtual ground sensing circuitry 500 operably coupled to the bit line 102 through the bit line decoder 430, in some embodiments the virtual ground sensing circuitry 500 may be operably coupled through a word line decoder to the word line 104 (to sense charge emitted by and sinked to the ferroelectric memory cell 106 through the word line 104 during sense operations) instead of, or in addition to the bit line 102.

In some embodiments, a virtual ground sensing circuit includes at least one sense circuit configured to compare a reference voltage potential to a sense node voltage potential of a sense node of the sense circuit. The sense node has a sense node capacitance. The virtual ground sensing circuit also includes virtual ground circuitry operably coupled to the at least one sense circuit. The virtual ground circuitry is configured to provide a virtual ground at a first bias potential to a conductive line operably coupled to a selected ferroelectric memory cell. The virtual ground circuitry is also configured to discharge the conductive line to the sense node of the sense circuit responsive to the selected ferroelectric memory cell changing from a first polarization state to a second polarization state. In some embodiments, the at least one sense circuit includes a transistor configured to selectively operably couple the sense node to a power voltage potential. In some embodiments, the transistor is configured to isolate the sense node from the power voltage potential during a sense operation of the selected ferroelectric memory cell. In some embodiments, the at least one sense circuit is configured to detect charge emitted by the selected ferroelectric memory cell when the selected ferroelectric memory cell changes from the first polarization state to the second polarization state. In some embodiments, the at least one sense circuit is configured to detect charge sinked to the selected ferroelectric memory cell if the selected ferroelectric memory cell changes from the first polarization state to the second polarization state. In some embodiments, the sense node capacitance is less than a capacitance of the conductive line. In some embodiments, the sense node capacitance includes a parasitic capacitance.

In some embodiments, the first polarization state and the second polarization state correspond to data states in a one-bit single-level polarization scheme. In some embodiments, the first polarization state corresponds to one of a digital logic "1" and a digital logic "0," and the second polarization state corresponds to the other of the digital logic "1" and the digital logic "0." In some embodiments, the first polarization state and the second polarization state correspond to data states in a multi-bit multi-level polarization scheme. In some embodiments, the first polarization state and the second polarization state correspond to data states in a two-bit multi-level polarization scheme.

The bit line decoder 430 may be configured to selectively couple the virtual ground sensing circuitry 500 to one or more of a number of different bit lines 102 (FIGS. 1 and 3). Thus, the bit line decoder 430 may enable the control circuitry 400 to access many different ferroelectric memory cells 106 separately, together, in subgroups, etc.

Figure 5A:
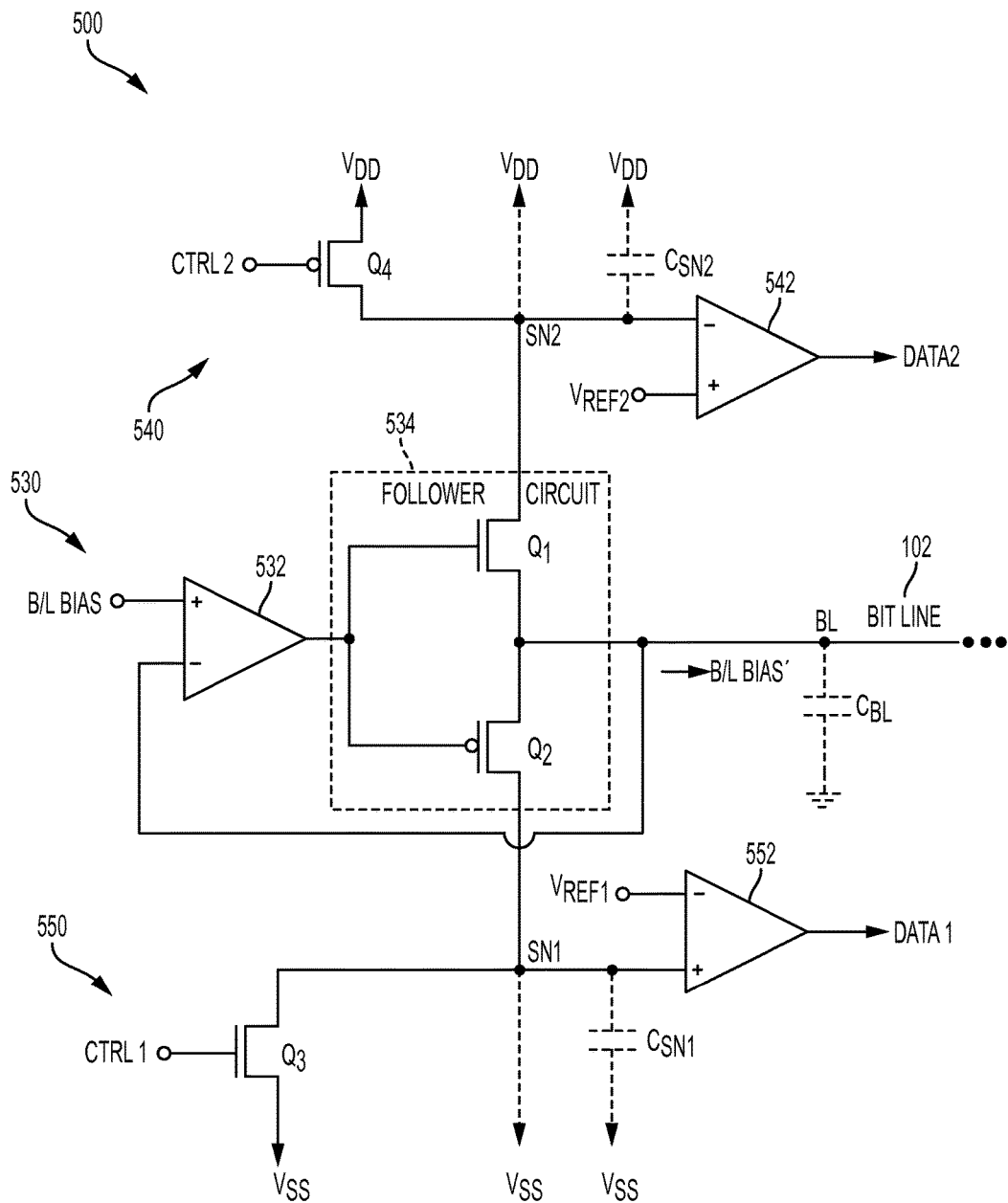
FIG. 5A is a schematic diagram of virtual ground sensing circuitry of the control circuitry of FIG. 4.

FIG. 5A is a schematic diagram of the virtual ground sensing circuitry 500. The virtual ground sensing circuitry 500 may include virtual ground circuitry 530 configured to receive the bit line bias voltage potential B/L BIAS from the biasing circuitry 410 (FIG. 4) and provide a virtual ground held at a voltage potential B/L BIAS' equal to the bit line bias voltage potential B/L BIAS to the bit line 102 (e.g., through the bit line decoder 430 of FIG. 4). The virtual ground sensing circuitry 500 may also include one or more sense circuits 540, 550 (sometimes referred to herein as "sense circuits" 540, 550) operably coupled to the virtual ground circuitry 530. The sense circuits 540, 550 may be configured to receive reference voltages $V_{REF2}$, $V_{REF1}$, respectively, from the biasing circuitry 410 (FIG. 4). The sense circuits 540, 550 may be configured to use the reference voltages $V_{REF2}$, $V_{REF1}$, respectively, as references to detect sinked charge and emitted charge, respectively, to and from a ferroelectric memory cell 106 (FIGS. 1, 2A, 3, 4) operably coupled to the bit line 102.

The bit line 102 may have a bit line capacitance $C_{BL}$ (illustrated in FIG. 5A with broken lines to indicate that the bit line capacitance $C_{BL}$ is merely the capacitance of the bit line 102 itself, not an actual capacitor operably coupled to the bit line 102) associated therewith. The bit line capacitance $C_{BL}$ may be a function of at least a number and size of ferroelectric memory cells 106 operably coupled to the bit line 102. For the sake of providing memory devices with high memory capacities, relatively long bit lines 102 operably coupled to a large number of ferroelectric memory cells 106 may be desirable. Accordingly, the bit line capacitance $C_{BL}$ may be relatively large (e.g., on the order of a pF) in some cases.

The virtual ground circuitry 530 may include an operational amplifier 532 operably coupled to a follower circuit 534. In some embodiments, the operational amplifier 532 may include an operational transconductance amplifier (OTA). A non-inverting input of the operational amplifier 532 may be operably coupled to the biasing circuitry 410 to receive the bit line bias voltage potential B/L BIAS. An output of the operational amplifier 532 may be operably coupled to an input of the follower circuit 534, and an output of the follower circuit 534 may be fed back to an inverting input of the operational amplifier 532.

The follower circuit 534 may include a pair of transistors Q1, Q2 in a source follower configuration. Transistor Q1 may include an n-type metal oxide semiconductor field effect transistor (n-MOS transistor), and transistor Q2 may include a p-type MOSFET transistor (p-MOS transistor). The input of the follower circuit 534 may include gates of transistors Q1 and Q2 operably coupled together. The output of the follower circuit 534 may include sources of transistors Q1 and Q2 operably coupled together. The output of the follower circuit 534 may be operably coupled to the bit line 102 (e.g., through the bit line decoder 430 of FIG. 4). With the output of the follower circuit 534 coupled to the bit line 102, and fed back to the non-inverting input of the operational amplifier 532, the bit line 102 may serve as a virtual ground at the voltage potential B/L BIAS' equal to the bit line bias voltage potential B/L BIAS. Accordingly, if charge is sinked to, or emitted from, a ferroelectric memory cell 106 operably coupled to the bit line 102, the sinked or emitted charge may be drawn from, or discharged to, the bit line 102. The bit line 102 may have a bit line capacitance $C_{BL}$ associated therewith.

Sense circuit 550 may be configured to sense charge emitted from a ferroelectric memory cell 106 operably coupled to the bit line 102. Charge may be emitted from a ferroelectric memory cell 106 if the ferroelectric memory cell 106 switches from a higher polarization state to a lower polarization state (e.g., switching from P1 ($+P_{R1}$) to P2 ($-P_{R1}$), from P2 ($-P_{R1}$) to P4 ($-P_{R2}$), from P3 ($+P_{R2}$) to P2 ($-P_{R1}$), from P3 ($+P_{R2}$) to P4 ($-P_{R2}$), from P1 ($+P_{R1}$) to P4 ($-P_{R2}$), etc.). Sense circuit 550 may include a comparator 552 configured to output a data signal DATA1. An inverting input of the comparator 552 may be operably coupled to the biasing circuitry 410 (FIG. 4), and configured to receive a reference voltage $V_{REF1}$. A non-inverting input of the comparator 552 may be operably coupled to a sense node SN1, which may, in turn, be operably coupled to a drain of transistor Q2 of the follower circuit 534. The sense node SN1 may have a sense node capacitance $C_{SN1}$ associated therewith. In some embodiments, the sense node capacitance may be a parasitic capacitance (parasitic capacitance $C_{SN1}$ is shown in broken lines to indicate that it may be merely a parasitic capacitance, not a separate capacitor added to the sensing circuitry 550). In some embodiments, the parasitic capacitance $C_{SN1}$ may include an actual capacitor operably coupled to the sense node SN1. The sense node capacitance $C_{SN1}$ may be relatively small compared to the bit line capacitance $C_{BL}$.

The sense circuit 550 may also include an n-MOS transistor Q3 configured to selectively operably couple the sense node SN1 to a low voltage potential power supply $V_{SS}$. A gate of transistor Q3 may be operably coupled to a memory controller (not shown), and configured to receive a control signal CTRL1. Control signal CTRL1 may be held at a logic level 1 to operably couple the sense node SN1 to $V_{SS}$, except during a sense operation to detect charge emitted from the ferroelectric memory cell 106.

In some embodiments, a virtual ground sensing circuit includes an operational amplifier including a non-inverting input, an inverting input, and an amplifier output. The virtual ground sensing circuit also includes a follower circuit including an n-MOS transistor and a p-MOS transistor. An input of the follower circuit includes a gate of the n-MOS transistor operably coupled to a gate of the p-MOS transistor. An output of the follower circuit includes a source of the n-MOS transistor operably coupled to a source of the p-MOS transistor. The output of the follower circuit is operably coupled to the inverting input of the operational amplifier. The virtual ground sensing circuit further includes a comparator configured to compare a sense node voltage at a drain of one of the n-MOS transistor and the p-MOS transistor to a reference voltage potential. In some embodiments, the virtual ground sensing circuit includes another comparator configured to compare another sense node voltage at a drain of the other of the n-MOS transistor and the p-MOS transistor to another reference voltage potential. In some embodiments, the drain of the other of the n-MOS transistor and the p-MOS transistor is operably coupled to a power supply voltage potential. In some embodiments, the drain of the one of the n-MOS transistor and the p-MOS transistor is operably coupled to a power supply voltage potential though a transistor configured to isolate the drain of the one of the n-MOS transistor and the p-MOS transistor from the power supply voltage potential during a sense operation. In some embodiments, the output of the follower circuit is operably coupled to a conductive line decoder configured to selectively operably couple the output of the follower circuit to one of a plurality of conductive lines of a memory cell array. In some embodiments, the comparator is configured to compare a drain voltage potential of the p-MOS transistor to the reference voltage potential. In some embodiments, the virtual ground sensing circuit includes a digital to analog converter (DAC) configured to provide the reference voltage potential to the comparator. A multi-bit digital signal swept from a low digital value to a high digital value is applied to an input of the DAC during a sense operation. In some embodiments, the virtual ground sensing circuit includes a latch network configured to store a digital value of the multi-bit digital signal that corresponds to a data state of a selected ferroelectric memory cell operably coupled to the conductive line. In some embodiments, the latch network is configured to be clocked by an output of the comparator.

In some embodiments, the virtual ground sensing circuit includes an operational amplifier having a non-inverting input configured to receive the second biasing signal, and a follower circuit including an n-MOS transistor and a p-MOS transistor. A source of the n-MOS transistor is operably coupled to each of a source of the p-MOS transistor, an inverting input of the operational amplifier, and the second electrode of the memory cell. A drain of the n-MOS transistor is operably coupled to a high voltage potential power supply. A drain of the p-MOS transistor is capacitively coupled to a low voltage potential power supply. A gate of the n-MOS transistor and a gate of the p-MOS transistor are both operably coupled to an output of the operational amplifier. The virtual ground sensing circuit further includes a comparator configured to compare a drain voltage potential of the drain of the p-MOS transistor to a reference voltage potential. In some embodiments, the drain of the p-MOS transistor is capacitively coupled to the low-voltage potential power supply through a parasitic capacitance. In some embodiments, the control circuitry also includes a bit line decoder configured to selectively operably couple the source of the n-MOS transistor to the second electrode of the memory cell.

Figure 5B:
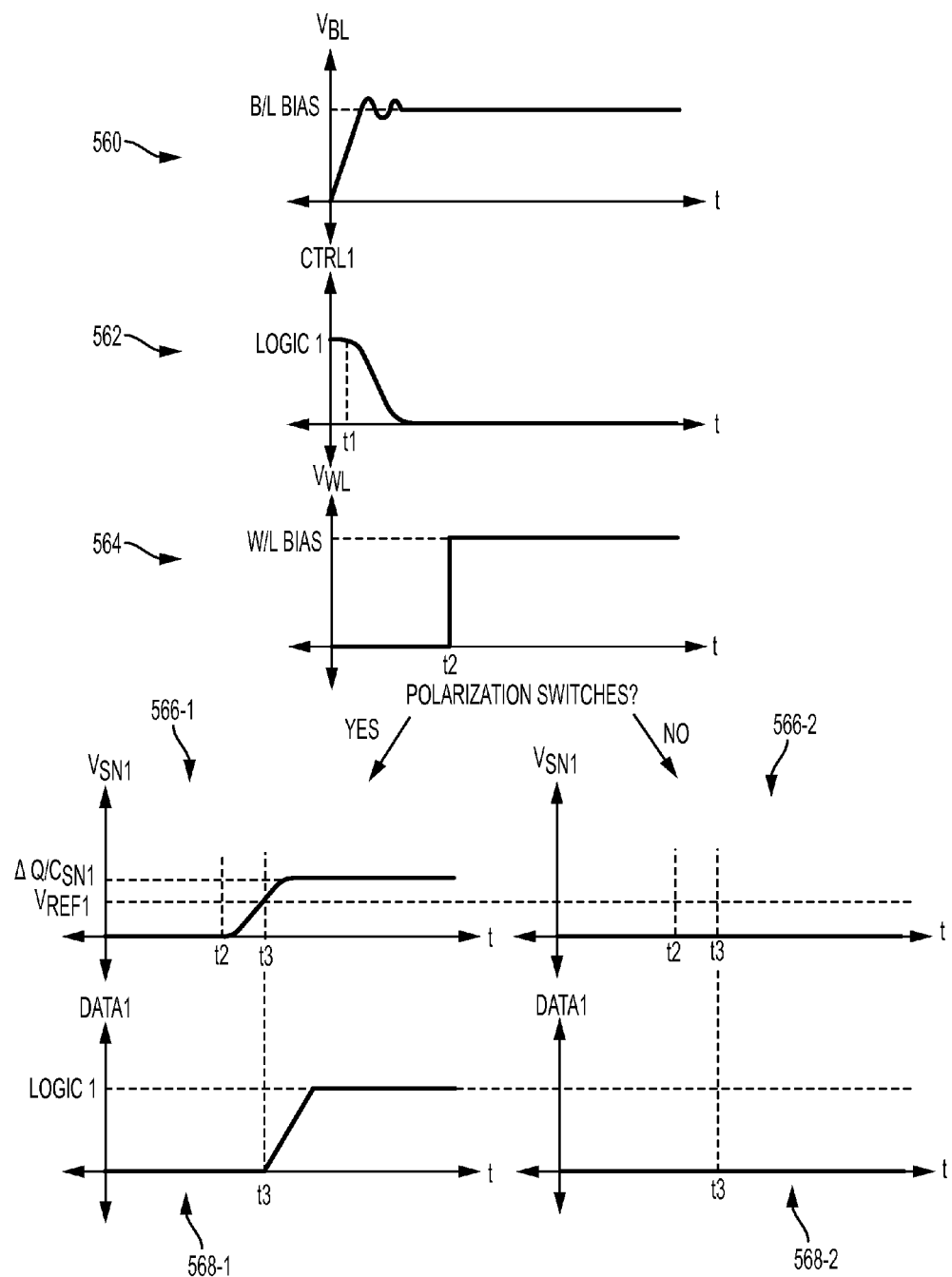
FIG. 5B illustrates plots of voltage potentials from the virtual ground sensing circuit of FIG. 5A during a sense operation of a selected ferroelectric memory cell in a single-level polarization scheme.

FIG. 5B illustrates plots 560, 562, 564, 566 (566-1 and 566-2), and 568 (568-1 and 568-2) of different voltage potentials $V_{BL}$, CTRL1, $V_{WL}$, $V_{SN1}$, and DATA1, respectively, from the virtual ground sensing circuit 500 plotted against time t during a sense operation of a selected ferroelectric memory cell 106 involving sense circuit 550 in a single-level polarization scheme (i.e., only polarization levels P1 (+$P_{R1}$) and P2 (-$P_{R1}$) are used). Referring to FIGS. 5A and 5B together, at time t=0, the biasing circuitry 410 (FIG. 4) may drive the non-inverting input of the operational amplifier 532 to bias voltage potential B/L BIAS. As a result, the virtual ground sensing circuitry 500 may drive node BL at a bit line 102 operably coupled to the selected ferroelectric memory cell to B/L BIAS' equal to B/L BIAS, as shown in the plot 560 of FIG. 5B. Also, the node BL may serve as a virtual ground at the voltage potential B/L BIAS'.

At time t1, a memory controller (not shown) operably coupled to the virtual ground sensing circuitry 500 may switch the control signal CTRL1 at the gate of transistor Q3 from a logic level 1 to a logic level 0, as shown in the plot 562 of FIG. 5B. Accordingly, sense node SN1 may be isolated from the low voltage potential power supply $V_{SS}$, except that the sense node SN1 may be capacitively coupled to the low voltage potential power supply $V_{SS}$ through the sense node capacitance $C_{SN1}$.

At time t2, the biasing circuitry 410 (FIG. 4) may drive a word line 104 operably coupled to the selected ferroelectric memory cell 106 to bias voltage potential W/L BIAS, as shown in plot 564 of FIG. 5B. Bias voltage potentials W/L BIAS and B/L BIAS may be selected to apply critical voltage -$V_{CR1}$ across the selected ferroelectric memory cell 106. Bias voltage potential W/L BIAS may be applied at a sufficient time t2 following the assertion of B/L BIAS to allow transients on the bit line 102 to dissipate to steady state B/L BIAS.

If the selected ferroelectric memory cell 106 is in polarization state P1 (+$P_{R1}$), the selected ferroelectric memory cell 106 may switch from polarization state P1 (+$P_{R1}$) to polarization state P2 (-$P_{R1}$), emitting charge ΔQ from the selected ferroelectric memory cell 106 to the bit line 102. The emitted charge ΔQ may slightly raise the voltage potential $V_{BL}$ on node BL (i.e., according to $\Delta V_{BL}=\Delta Q/C_{BL}$), and the operational amplifier 532 may drive the input of the follower circuit 534 low, operably coupling bit line node BL to sense node SN1. The charge ΔQ from the selected ferroelectric memory cell 106 may be discharged to the sense node SN1, and the voltage potential $V_{SN1}$ of the sense node SN1 may rise (i.e., according to $\Delta V_{SN1}=\Delta Q/C_{SN1}$), as shown in plot 566-1.

As previously discussed, comparator 552 may be configured to compare the reference voltage $V_{REF1}$ to the voltage $V_{SN1}$ of the sense node SN1. The reference voltage $V_{REF1}$ may be selected to be between the low voltage potential power supply $V_{SS}$ and the voltage potential that would result on the sense node SN1 if the selected ferroelectric memory cell 106 emits charge ΔQ to the bit line 102 (i.e., $V_{SS}<V_{REF1}<(V_{SS}+\Delta Q/C_{SN1})$). Accordingly, when the voltage potential of the sense node $V_{SN1}$ at time t3 surpasses the reference voltage $V_{REF1}$, as shown in the plot 566-1 of FIG. 5B, the comparator 552 may switch from outputting a logic level 0 to a logic level 1 at time t3, as shown in the plot 568-1 of FIG. 5B.

If, however, the selected ferroelectric memory cell 106 is already in polarization state P2 (-$P_{R1}$), the selected ferroelectric memory cell 106 may not switch polarization states. Accordingly, the selected ferroelectric memory cell 106 may not emit charge ΔQ. Thus, charge ΔQ may not be conducted through transistor Q2 to the sense node SN1, and the voltage potential $V_{SN1}$ of sense node SN1 may remain unchanged at times t2 and t3, as shown in plot 566-2 of FIG. 5B. Also, the voltage potential $V_{SN1}$ of the sense node SN1 may not surpass the reference voltage $V_{REF1}$. Accordingly, the comparator 552 may not switch from outputting the logic level 0 to the logic level 1 at time t3, as shown in the plot 568-2 of FIG. 5B.

It may, therefore, be determined whether the selected ferroelectric memory cell was in polarization state P1 (+$P_{R1}$) or polarization state P2 (-$P_{R1}$) by applying the critical voltage -$V_{CR1}$ to the selected ferroelectric memory cell 106, and monitoring the output DATA1 of the comparator 552. If DATA1 switches to logic 1 at time t3, the selected ferroelectric memory cell 106 was in polarization state P1. If it is desired for the ferroelectric memory cell 106 to persist in polarization state P1 after the sense operation, the ferroelectric memory cell 106 may then be biased to critical voltage $V_{CR1}$ to switch the polarization of the ferroelectric memory cell 106 back to polarization state P1 (because sensing the ferroelectric memory cell 106 switched the polarization to state P2). If, however, DATA1 remains at logic 0, the selected ferroelectric memory cell 106 was in polarization state P2. The ferroelectric memory cell 106 may then be left in polarization state P2, if desired.

The polarization state of the selected ferroelectric memory cell 106 may be determined using only the sense circuit 550, and not the sense circuit 540 (or by using only the sense circuit 540, and not the sense circuit 550, as will be discussed with reference to FIG. 5C). Thus, in some embodiments, the virtual ground sensing circuitry 500 may only include the virtual ground circuitry 530 and the sense circuit 550. In such embodiments, a drain of transistor Q1 of the follower circuit 534 may be operably coupled to a high voltage potential power supply $V_{DD}$ (shown in broken lines).

In some embodiments, the virtual ground sensing circuitry 500 may include both sense circuit 540 and sense circuit 550.

As previously discussed, the bit line capacitance $C_{BL}$ may be relatively large. The sense node capacitance $C_{SN1}$ on the may be relatively low, by comparison. Accordingly, a voltage change $\Delta V_{SN1}$ on the sense node SN1 may be relatively large (i.e., $\Delta Q/C_{SN1}$) compared to a voltage change $\Delta V_{BL}$ (i.e., $\Delta Q/C_{BL}$) on the bit line when the charge $\Delta Q$ is emitted by the selected ferroelectric memory cell 106. As a result, the virtual ground sensing circuitry 500 may be capable of detecting much smaller emitted charge $\Delta Q$ than conventional sense amplifiers, which typically compare the bit line voltage $V_{BL}$ to a reference voltage.

As the voltage change $\Delta V_{SN1}$ on the sense node SN1 is inversely proportional to the sense node capacitance $C_{SN1}$, the sensitivity of the virtual ground sensing circuitry 500 may increase as the sense node capacitance $C_{SN1}$ decreases. Thus, it may be advantageous to provide the sense node with a capacitance $C_{SN1}$ that is substantially lower than the bit line capacitance $C_{BL}$. As previously discussed, in some embodiments, the sense node capacitance may include a parasitic capacitance of the node SN1 to provide as small as possible a sense node capacitance $C_{SN1}$, and therefore, to therefore to increase $\Delta V_{SN1}$.

Also, as previously discussed with reference to FIGS. 2A and 2B, the charge $\Delta Q$ emitted from the selected ferroelectric memory cell 106 may be proportional to the area A of the selected ferroelectric memory cell 106 (i.e., $\Delta Q=2(A)(P_{R1})$). Accordingly, the virtual ground sensing circuitry 500 may be capable of sensing ferroelectric memory cells 106 that have much smaller area A than conventional sense amplifiers that monitor a bit line (or word line) voltage. Specifically, a ratio of $\Delta V_{SN1}$ to $\Delta V_{BL}$ may be $C_{BL}/C_{SN1}$. It follows, then, that the virtual ground sensing circuitry 500 may be capable of sensing ferroelectric memory cells 106 having an area A that is smaller than an area of ferroelectric memory cells sensed by conventional sense amplifiers by a factor of about $C_{BL}/C_{SN1}$. If a small parasitic capacitance $C_{SN1}$ is achieved, it may be possible to sense ferroelectric memory cells 106 with areas A that rival, or are even smaller than, areas of known NAND flash memory cells.

It should be noted that the follower circuit 534 may have a "dead zone" where the input of the follower circuit does not trigger either transistor Q1 or transistor Q2 (i.e., the input of the follower circuit is less than a threshold voltage $V_{IN}$ of transistor Q1, and greater than a threshold voltage of transistor $V_{TP}$). Accordingly, in order for the follower circuit 534 to discharge the charge emitted from/sinked to the selected ferroelectric memory cell 106 to the sense node SN1, the open-loop gain $A_{OL}$ of the operational amplifier 532 should be selected according to $A_{OL} \geq (V_{TP}+V_{TN})V_{BL}$. By way of non-limiting example, assuming that $V_{TP}+V_{TN}=2$ volts (V), and the open loop gain $A_{OL}$ is 10,000, the virtual ground sensing circuitry 500 should be capable of detecting a change in bit line voltage $\Delta V_{BL}$ of 200 μV. Also, smaller changes in bit line voltage $\Delta V_{BL}$ may be detected if the open loop gain $A_{OL}$ is 10,000 is selected to be higher. It will be observed that the bit line capacitance $C_{BL}$ and bit line resistance do not factor into these design equations. Although bit line resistance may factor into the access time of the selected ferroelectric memory cell 106, however, the access time for ferroelectric memory cells may be on the order of a microsecond, which is about a tenth of the current access time for known NAND Flash memory cells.

Figure 5C:
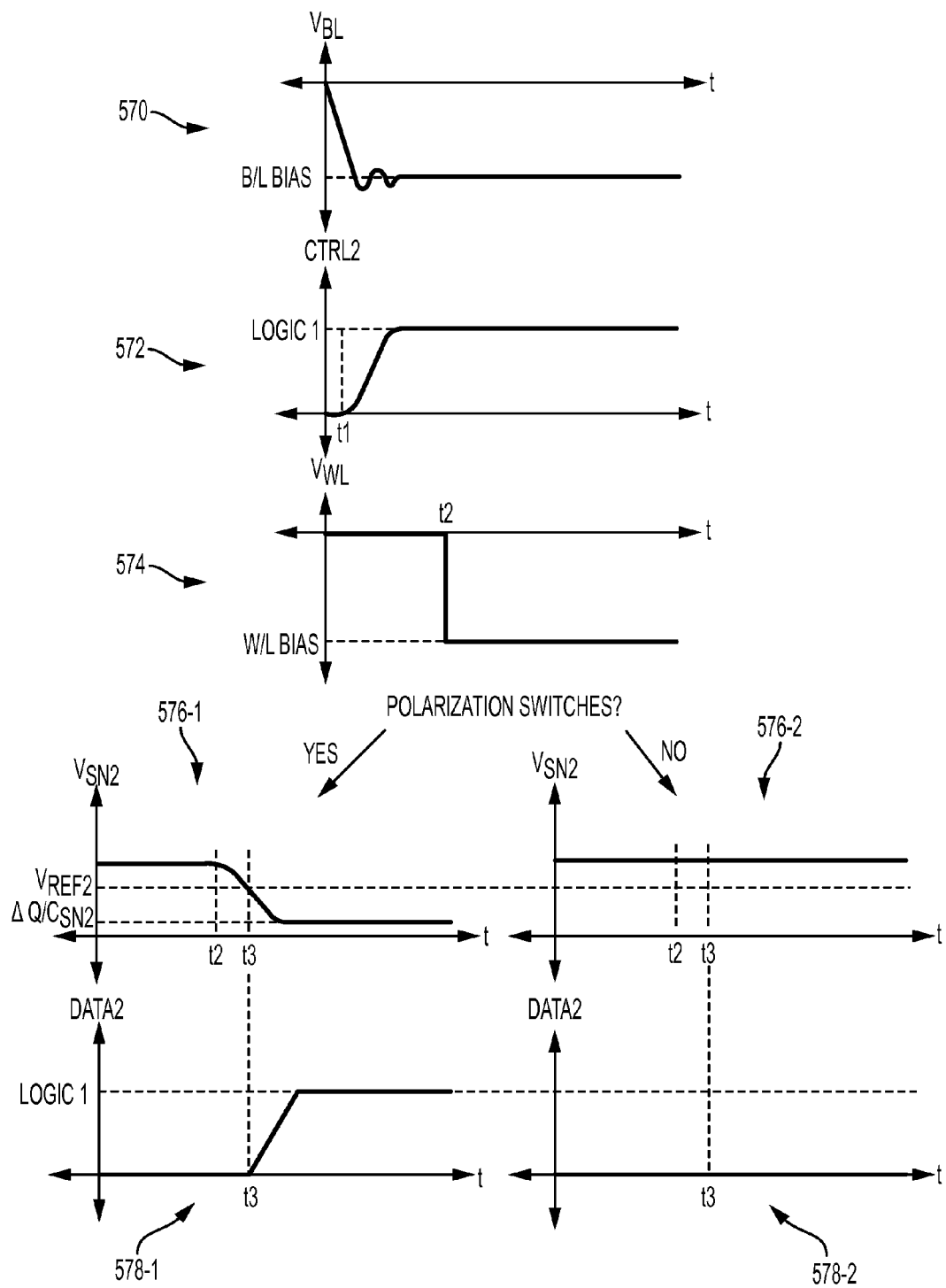
FIG. 5C illustrates other plots of voltage potentials from the virtual ground sensing circuit of FIG. 5A during a sense operation of a selected ferroelectric memory cell in a single-level polarization scheme.

FIG. 5C illustrates plots 570, 572, 574, 576 (576-1 and 576-2), and 578 (578-1 and 578-2) of different voltage potentials $V_{BL}$, CTRL2, $V_{WL}$, $V_{SN2}$, and DATA2, respectively, from the virtual ground sensing circuitry 500 plotted against time t during a sense operation of a selected ferroelectric memory cell 106 involving sense circuit 540 in a single-level polarization scheme (i.e., only polarization levels P1 ($+P_{R1}$) and P2 ($-P_{R1}$) are used). Referring to FIGS. 5A and 5C together, sense circuit 540 may be configured to sense charge sinked to a ferroelectric memory cell 106 operably coupled to the bit line 102. Charge may be sinked to a ferroelectric memory cell 106 if the ferroelectric memory cell 106 switches from a lower polarization state to a higher polarization state (e.g., switching from P2 ($-P_{R1}$) to P1($+P_{R1}$)). Sense circuit 540 may include a comparator 542 configured to output a data signal DATA2. A non-inverting input of the comparator 542 may be operably coupled to the biasing circuitry 410 (FIG. 4), and configured to receive a reference voltage $V_{REF2}$. An inverting input of the comparator 542 may be operably coupled to a sense node SN2, which may in turn be operably coupled to a drain of transistor Q1 of the follower circuit 534. The sense node SN2 may have a sense node capacitance $C_{SN2}$ associated therewith. In some embodiments, the sense node capacitance may be a parasitic capacitance (parasitic capacitance $C_{SN2}$ is shown in broken lines to indicate that it may be merely a parasitic capacitance, not a separate capacitor added to the sensing circuitry 550). The sense node capacitance $C_{SN2}$ may be relatively small compared to the bit line capacitance $C_{BL}$.

The sense circuit 540 may also include a p-MOS transistor Q4 configured to selectively operably couple the sense node SN2 to a high voltage potential power supply $V_{DD}$. A gate of transistor Q3 may be operably coupled to a memory controller (not shown), and configured to receive a control signal CTRL2. Control signal CTRL2 may be held at a logic level 0 to operably couple the sense node SN2 to $V_{DD}$, except during a sense operation to detect charge sinked to the ferroelectric memory cell 106.

During a sense operation involving the sense circuit 540, at time t=0, the biasing circuitry 410 (FIG. 4) may drive the non-inverting input of the operational amplifier 532 to bias voltage potential B/L BIAS. As a result, the virtual ground circuitry 500 may drive node BL at a bit line 102 operably coupled to the selected ferroelectric memory cell 106 to B/L BIAS' equal to B/L BIAS, as shown in the plot 570 of FIG. 5C. Also, the node BL may serve as a virtual ground at the voltage potential B/L BIAS'.

At time t1, a memory controller operably coupled to the virtual ground sensing circuitry 500 may switch the control signal CTRL2 at the gate of transistor Q4 from a logic level 0 to a logic level 1, as shown in the plot 572 of FIG. 5C. Accordingly, sense node SN2 may be isolated from the high voltage potential power supply $V_{DD}$, except that the sensing node SN2 may be capacitively coupled to the high voltage potential power supply $V_{DD}$ through the sense node capacitance $C_{SN2}$.

At time t2, the biasing circuitry 410 (FIG. 4) may drive a word line 104 operably coupled to the selected ferroelectric memory cell 106 to bias voltage potential W/L BIAS, as shown in plot 574 of FIG. 5C. Bias voltage potentials W/L BIAS and B/L BIAS may be selected to apply critical voltage $V_{CR}$, across the selected ferroelectric memory cell 106. Bias voltage potential W/L BIAS may be applied to the ferroelectric memory cell 106 at a time t2 after the bit line is biased to B/L BIAS to allow any transients to dissipate to steady state.

If the selected ferroelectric memory cell 106 is in polarization state P2 ($-P_{R1}$), the selected ferroelectric memory cell 106 may switch from polarization state P2 ($-P_{R1}$) to polarization state P1 (+$P_{R1}$), sinking charge $\Delta Q$ to the selected ferroelectric memory cell 106 from the bit line 102. The sinked charge $\Delta Q$ may slightly decrease the voltage potential $V_{BL}$ on node BL (i.e., according to $\Delta V_{BL}=\Delta Q/C_{BL}$), and the operational amplifier 532 may drive the input of the follower circuit 534 high, operably coupling bit line node BL to sensing node SN2. The charge $\Delta Q$ sinked to the selected ferroelectric memory cell 106 may be drawn from the sense node SN2, and the voltage potential $V_{SN2}$ of the sense node SN2 may decrease (i.e., according to $\Delta V_{SN2}=\Delta Q/C_{SN2}$), as shown in plot 576-1.

As previously discussed, comparator 542 may be configured to compare the reference voltage $V_{REF2}$ to the voltage $V_{SN2}$ of the sense node SN2. The reference voltage $V_{REF2}$ may be selected to be between the high voltage potential power supply $V_{DD}$ and the voltage potential that would result on the sense node SN2 if the selected ferroelectric memory cell 106 sinks charge $\Delta Q$ from the bit line 102 (i.e., ($V_{DD}-\Delta Q/C_{SN2})<V_{REF2}<V_{DD}$). Accordingly, when the voltage potential of the sense node $V_{SN2}$ at time t3 decreases below the reference voltage $V_{REF2}$, as shown in the plot 576-1 of FIG. 5C, the comparator 542 may switch from outputting a logic level 0 to a logic level 1 at time t3, as shown in the plot 578-1 of FIG. 5C.

If, however, the selected ferroelectric memory cell 106 is already in polarization state P1 (+$P_{R1}$), the selected ferroelectric memory cell 106 may not switch polarization states. Accordingly, the selected ferroelectric memory cell 106 may not sink charge $\Delta Q$. Thus, charge $\Delta Q$ may not be conducted through transistor Q1 from the sense node SN2, and the voltage potential $V_{SN2}$ of sense node SN2 may remain unchanged at times t2 and t3, as shown in plot 576-2 of FIG. 5C. In turn, the comparator 542 may not switch from outputting the logic level 0 to the logic level 1 at time t3, as shown in the plot 578-2 of FIG. 5C.

It may, therefore, be determined whether the selected ferroelectric memory cell was in polarization state P1 (+$P_{R1}$) or polarization state P2 (-$P_{R1}$) by applying the critical voltage $V_{CR1}$ to the selected ferroelectric memory cell 106, and monitoring the output DATA2 of the comparator 542. If DATA2 switches to logic 1 at time t3, the selected ferroelectric memory cell 106 was in polarization state P2 (-$P_{R1}$). If it is desired for the ferroelectric memory cell 106 to persist in polarization state P2 (-$P_{R1}$) after the sense operation, the ferroelectric memory cell 106 may then be biased to critical voltage $V_{CR2}$ to switch the polarization of the ferroelectric memory cell 106 back to polarization state P2 (because sensing the ferroelectric memory cell 106 switched the polarization to state P1). If, however, DATA2 remains at logic 0, the selected ferroelectric memory cell 106 was in polarization state P1. The ferroelectric memory cell 106 may then be left in polarization state P1 (+$P_{R1}$), if desired.

Similar to the sense circuit 550 discussed above with reference to FIGS. 5A and 5B, the polarization state of the selected ferroelectric memory cell 106 may be determined using only the sense circuit 540 (without the sense circuit 550). Thus, in some embodiments, the virtual ground sensing circuitry 500 may only include the virtual ground circuitry 530 and the sense circuit 540. In such embodiments, a drain of transistor Q2 of the follower circuit 534 may be operably coupled to a low voltage potential power supply $V_{ss}$ (shown in broken lines). As previously discussed, the virtual ground sensing circuitry 500 may include both sense circuit 540 and sense circuit 550.

Figure 6A:
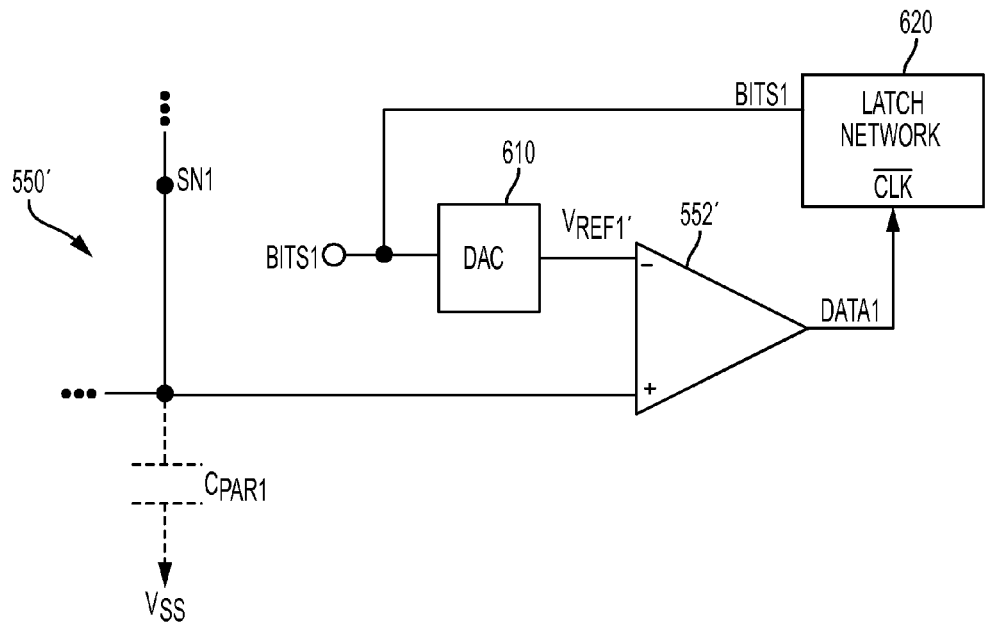
FIGS. 6A and 6B illustrate a sense circuit and plots of related voltage potentials according to embodiments of the disclosure.
Figure 6B:
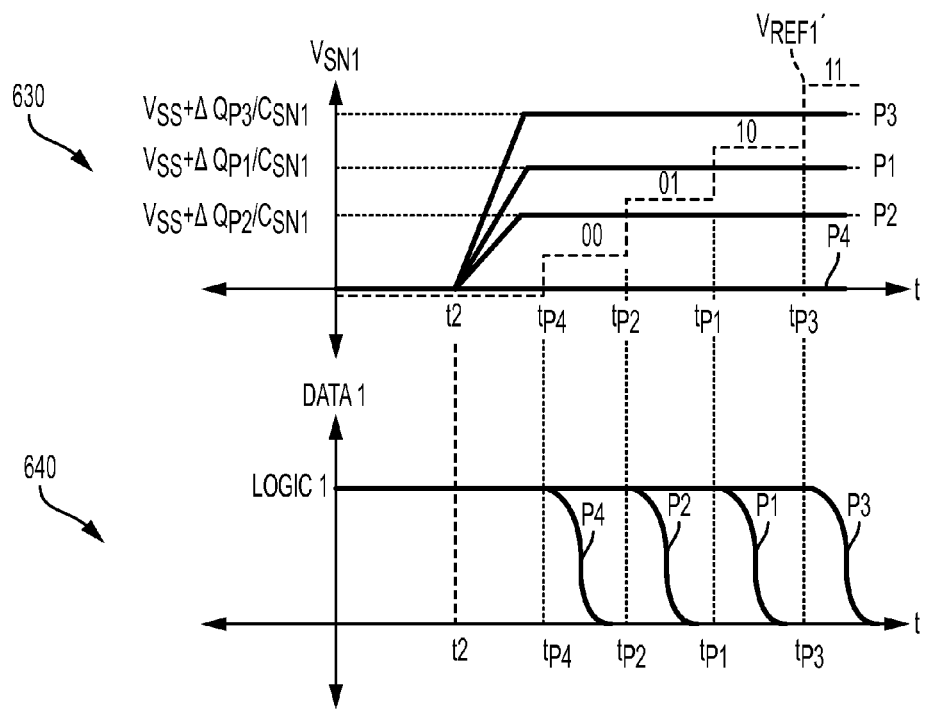

FIGS. 6A and 6B illustrate a sense circuit 550' and plots of related voltage potentials according to embodiments of the disclosure. FIG. 6A is a schematic view of a sense circuit 550' that may replace the sense circuit 550 of the virtual ground sensing circuitry 500 of FIG. 5A. FIG. 6B illustrates plots 630, 640 of voltage potentials $V_{SN1}$, DATA 1, respectively of the sense circuit 550' of FIG. 6A.

Referring to FIGS. 5A and 6A together, the sense circuit 550' may be similar to the sense circuit 550 except the sense circuit 550' may be configured to detect emitted charge $\Delta Q$ resulting from polarization changes in a multi-level polarization scheme (e.g., polarization states P1, P2, P3, P4, etc., may be used). Although the present discussion refers to a two-bit sensing scheme using polarization levels P1, P2, P3, and P4 (corresponding to polarization levels +$P_{R1}$, -$P_{R1}$, +$P_{R2}$, and -$P_{R2}$, respectively), the disclosure is not so limiting. For example, a three-bit scheme including polarization levels P1, P2, P3, P4, P5, and P6 may be used, and so on to four-bit schemes, etc., so long as the ferroelectric memory cells 106 exhibit multi-level ferroelectric states due to different critical voltages applied thereto.

The sense circuit 550' may include a comparator 552', a digital to analog converter (DAC) 610, and a latch network 620. A non-inverting input of the comparator 552' may be operably coupled to sense node SN1, similar to the comparator 552 of the sense circuit 550 of FIG. 5. Accordingly, the non-inverting input of the comparator 552' may be operably coupled to a drain of transistor Q2 of the follower circuit 534 of FIG. 5A.

An input of the DAC 610 may be configured to receive a digital signal BITS1 (e.g., from the biasing circuitry 410 of FIG. 4, from a memory controller, etc.). An output of the DAC 610 may be operably coupled to an inverting input of the comparator 552'.

The latch network 620 may include latches, each of the latches configured to store a digital bit. If the digital signal BITS1 includes two bits, then the latch network 620 may include at least two latches. If the digital signal BITS2 includes three bits, the latch network 620 may include at least three bits, etc. An input of the latch network 620 may be configured to receive the digital signal BITS1. Accordingly, the input of the latch network 620 may be operably coupled to the input of the DAC 610. The latch network 620 may also include a clock input $\overline{CLK}$. The clock input $\overline{CLK}$ may be operably coupled to an output of the comparator 552'. Accordingly, the latch network 620 may be configured to store digital bits applied by BITS1 to the input of the latch network 620 when the output of the comparator 552 toggles from high to low.

The digital signal BITS1 may include a bus of digital bit signals (e.g., a two-bit signal, a three-bit signal, a four-bit signal, etc.). During a sense operation, the digital signal BITS1 may be swept from low to high digital values. Accordingly, an output of the DAC 610 may provide a voltage signal $V_{REF1}'$ that steps up from a low voltage potential level to a high voltage potential level.

Referring now to FIGS. 5A, 5B, 6A, and 6B together, the virtual ground sensing circuitry 500 including the sense circuit 550' may perform a sense operation. Plots 560, 562, and 564 of FIG. 5B corresponding to $V_{BL}$, CTRL1, and $V_{WL}$ are the same for the multi-level polarization scheme. B/L BIAS and W/L BIAS, however, may be selected to apply a critical voltage potential corresponding to a polarization level with a highest magnitude and a negative orientation (e.g., -$V_{CR2}$) to a selected ferroelectric memory cell 106. By way of non-limiting example, in a two-bit polarization scheme, the P4 (-$P_{R2}$) polarization level has the highest magnitude and negative polarity (out of P1 (+$P_{R1}$), P2-$P_{R1}$), P3 (+$P_{R2}$), and P4 (-$P_{R2}$)). Accordingly, B/L BIAS and W/L BIAS may be selected to apply the critical voltage potential $-V_{CR2}$ to the selected ferroelectric memory cell 106.

When the critical voltage potential $-V_{CR2}$ is applied to the selected ferroelectric memory cell 106, the selected ferroelectric memory cell 106 may switch to polarization state P4 $(-P_{R2})$, unless the selected ferroelectric memory cell 106 was already in polarization state P4. Accordingly, charge $\Delta Q$ may be emitted from the selected ferroelectric memory cell 106 when the critical voltage potential $-V_{CR2}$ is applied to the selected ferroelectric memory cell 106 if there is a change in polarization state. The magnitude of the charge $\Delta Q$ emitted from the selected ferroelectric memory cell 106 may be different depending on whether the ferroelectric memory cell 106 switches from polarization state P1 to P4 $(\Delta Q_{P1})$, from polarization state P2 to P4 $(\Delta Q_{P2})$, or from polarization state P3 to P4 $(\Delta Q_{P3})$.

As previously discussed with reference to FIG. 5B, a voltage change $\Delta V_{SN1}$ at the sense node SN1 of the sense circuit 550' may be greater by a factor of $C_{BL}/C_{SN1}$ than a voltage change $\Delta V_{BL}$ on the bit line 102 as a result of any charge $\Delta Q$ emitted by the selected ferroelectric memory cell 106. The change in voltage $\Delta V_{SN1}$ at the sense node SN1 may be $\Delta Q_{P1}/C_{SN1}$ for a switch from polarization state P1 $(+P_{R1})$ to P4 $(-P_{R2})$, $\Delta Q_{P2}/C_{SN1}$ for a switch from polarization state P2 $(-P_{R1})$ to P4 $(-P_{R2})$, $Q_{P3}/C_{SN1}$ for a switch from polarization state P3 $(+P_{R2})$ to P4 $(-P_{R2})$, and no change if the polarization state stays at P4 $(-P_{R2})$. Plot 630 of FIG. 6B illustrates the change in $V_{SN1}$ that occurs at time t2 (when the critical voltage potential $-V_{CR2}$ is applied to the selected ferroelectric memory cell 106) for each of the different polarization states P1, P2, P3, P4 the selected memory cell 106 may have been in when the critical voltage $-V_{CR2}$ was applied. As illustrated in the plot 630, switching from polarization state P3 to P4 results in the largest change in $V_{SN1}$. Switching from P1 to P4 results in less change in $V_{SN1}$. Switching from P2 to P4 results in still less change in $V_{SN1}$. Of course, staying in P4 results in no change in $V_{SN1}$.

After the critical voltage $-V_{CR2}$ has been applied to the selected ferroelectric memory cell 106, the digital signal BITS1 may be swept from low to high. As a result, $V_{REF1}'$ may exhibit a stepping pattern, as shown in the plot 630. Each step in the stepping pattern of $V_{REF1}'$ may be associated with a different digital value of BITS1 driving the DAC 610. By way of non-limiting example, a digital 00 may be associated with a first step, a digital 01 may be associated with a second step, a digital 10 may be associated with a third step, and a digital 11 may be associated with a fourth step. As long as the step size of $V_{REF1}'$ is approximately equal to the distance between the different possible voltage levels of $V_{SN1}$ (resulting from the different voltage changes in $V_{SN1}$ when different charges are emitted responsive to changes in polarization states of the selected ferroelectric memory cell 106), the different digital signals (e.g., 00, 01, 10, 11) of BITS1 may also be associated with the different polarization states P1, P2, P3, P4 (e.g., P4 may be associated with 00, P2 may be associated with 01, P1 may be associated with 10, and P3 may be associated with 11).

As illustrated in plot 630, $V_{REF1}'$ may intersect $V_{SN1}$ at time $t_{P4}$ if the selected ferroelectric memory cell 106 was in polarization state P4. Also, $V_{REF1}'$ may intersect $V_{SN1}$ at time $t_{P2}$ if the selected ferroelectric memory cell 106 was in polarization state P2. Furthermore, $V_{REF1}'$ may intersect $V_{SN1}$ at time $t_{P1}$ if the selected ferroelectric memory cell 106 was in polarization state P1. In addition, $V_{REF1}'$ may intersect $V_{SN1}$ at time $t_{P3}$ if the selected ferroelectric memory cell 106 was in polarization state P3. As a result, the output DATA1 of the comparator 552', which is configured to compare $V_{REF1}'$ to $V_{SN1}$, toggles from a logic 1 to a logic 0 at a different time depending on the polarization state of the selected ferroelectric memory cell 106, as illustrated in plot 640.

When the output DATA1 of the comparator 552' toggles to a logic 0, the latch network 620 may store the digital signal BITS1 asserted at the input of the latch network 620, which is the same as the digital signal BITS1 driving the DAC 610 (and $V_{REF1}'$, by extension). Accordingly, in the example of FIG. 6B, if the polarization state of the selected ferroelectric memory cell 106 was P4, the latch network 620 will store a 00. Also, if the polarization state was P2, the latch network 620 will store a 01. If the polarization state was P1, the latch network 620 will store 10. If the polarization state was P3, the latch network 620 will store 11. Thus, by applying the critical voltage $-V_{CR2}$, and sweeping the digital signal BITS1, and reading data stored by the latch network 620, it may be determined what data state the selected ferroelectric memory cell 106 was in.

Of course, this sense operation switches the selected ferroelectric memory cell 106 to polarization state P4 regardless of the polarization state the selected ferroelectric memory cell 106 was in before. Accordingly, if it is desired to preserve the data that was stored in the selected ferroelectric memory cell 106, the polarization state associated with the digital signal 00, 01, 10, 11 may be re-applied to the selected ferroelectric memory cell 106 by applying the corresponding critical voltage $V_{CR1}$, $-V_{CR1}$, $V_{CR2}$, $-V_{CR2}$.

In some embodiments, rather than sweeping the digital signal BITS1 from low to high, the digital signal BITS1 may instead be swept from high to low.

In some embodiments, rather than using steps of the reference voltage $V_{REF1}$ that are approximately equal to the differences in $V_{SN1}$ depending on the different polarization states of the selected ferroelectric memory cell 106, the steps may be smaller than the differences in $V_{SN1}$. In such embodiments, the digital signal BITS1 may include more bits than are stored in the ferroelectric memory cell 106, and only some of the possible combinations of the bits in BITS1 may correspond to the different polarization states of the ferroelectric memory cell 106.

In some embodiments, the comparator 552' may instead compare an analog reference voltage sweeping linearly from low to high or from high to low to $V_{SN1}$, and the analog reference voltage may be applied to an analog to digital converter, which then provides a digital signal corresponding to the analog voltage to the latch network 620. The output of the comparator 552' may clock the latch network 620 to store a digital value corresponding to the value of the analog voltage that toggled the comparator. In this configuration, digital values may be assigned to the different polarization states similarly to the example discussed with respect to FIGS. 6A and 6B.

In some embodiments, a "parallel" sensing scheme for sensing $V_{SN1}$ may be used. For example, multiple comparators may each be configured to compare $V_{SN1}$ to a different one of a plurality of different reference voltages, each selected to correspond to a different data state 00, 01, 10, 11. By analyzing the outputs of the comparators (e.g., observing which comparators toggle), the polarization state (and therefore the corresponding data state) may be determined. Other sense circuit configurations are also contemplated within the scope of the disclosure.

Figure 7A:
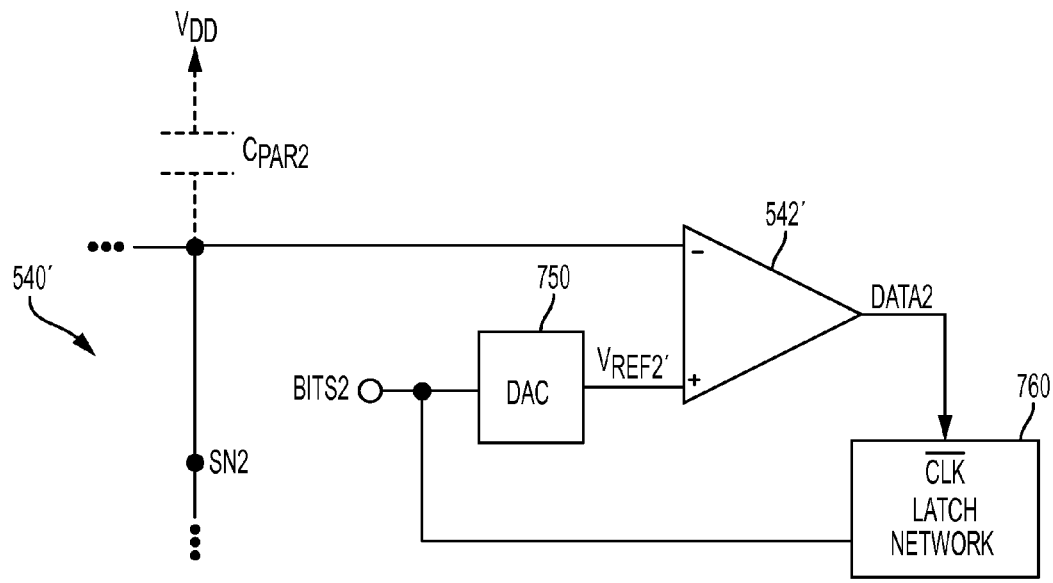
FIGS. 7A and 7B illustrate another sense circuit and plots of related voltage potentials according to embodiments of the disclosure.
Figure 7B:
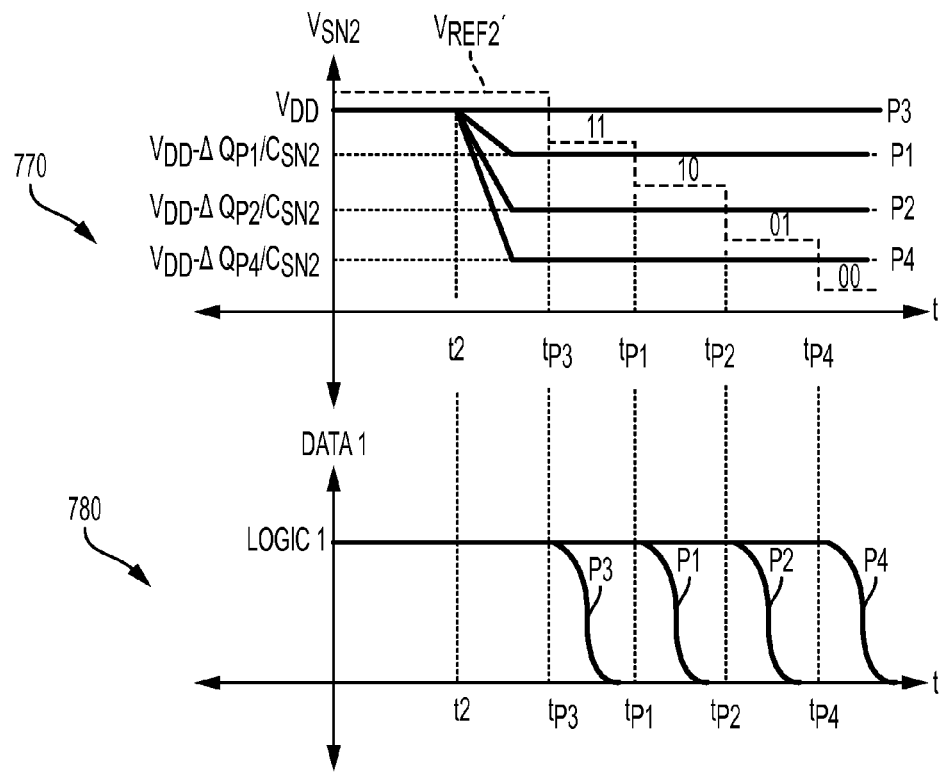

FIGS. 7A and 7B illustrate an embodiment of a sense circuit 540' according to embodiments of the disclosure. FIG. 7A is a schematic view of the sense circuit 540' that may replace the sense circuit 540 of the virtual ground sensing circuitry 500 of FIG. 5A. FIG. 7B illustrates plots 770, 780 of voltage potentials of the sense circuit 540' of FIG. 7A.

Referring to FIGS. 5A and 7A together, the sense circuit 540' may be complementary to the sense circuit 550' discussed above with reference to FIG. 6A (i.e., configured to detect charges sinked to the selected ferroelectric memory cell instead of charges emitted from the selected ferroelectric memory cell 106, as is the case with the sense circuit 550'). The sense circuit 540' may be similar to the sense circuit 540 except the sense circuit 540' may be configured to detect sinked charge ΔQ resulting from polarization changes in a multi-level polarization scheme (e.g., polarization states P1, P2, P3, P4, etc., may be used). Although the present discussion refers to a two-bit sensing scheme using polarization states P1, P2, P3, and P4 (corresponding to polarization levels $+P_{R1}$, $-P_{R1}$, $+P_{R2}$, and $-P_{R2}$, respectively), the disclosure is not so limiting. For example, a three-bit scheme including polarization levels P1, P2, P3, P4, P5, and P6 could be used, and so on to four-bit schemes, etc., so long as the ferroelectric memory cells 106 exhibit multi-level ferroelectric states due to different critical voltages applied thereto.

The sense circuit 540' may include a comparator 542', a digital to analog converter (DAC) 750, and a latch network 760. An inverting input of the comparator 542' may be operably coupled to sense node SN2, similar to the comparator 542 of the sense circuit 540 of FIG. 5A. Accordingly, the inverting input of the comparator 542' may be operably coupled to a drain of transistor Q1 of the follower circuit 534 of FIG. 5A.

An input of the DAC 750 may be configured to receive a digital signal BITS2 (e.g., from the biasing circuitry 410 of FIG. 4, from a memory controller, etc.). An output of the DAC 750 may be operably coupled to an inverting input of the comparator 542'.

The latch network 760 may include latches, each of the latches configured to store a digital bit. If the digital signal BITS2 includes two bits, then the latch network 760 may include at least two latches. If the digital signal BITS2 includes three bits, the latch network 760 may include at least three bits, etc. An input of the latch network 760 may be configured to receive the digital signal BITS2. Accordingly, the input of the latch network 620 of FIG. 6A may be operably coupled to the input of the DAC 750. The latch network 760 may also include a clock input $\overline{CLK}$. The clock input $\overline{CLK}$ may be operably coupled to an output of the comparator 542'. Accordingly, the latch network 760 may be configured to store digital bits applied by BITS2 to the input of the latch network 760 when the output of the comparator 542' toggles from high to low.

The digital signal BITS2 may include a bus of digital bit signals (e.g., a two-bit signal, a three-bit signal, a four-bit signal, etc.). During a sense operation, the digital signal BITS2 may be swept from high to low digital values. Accordingly, an output of the DAC 750 may provide a voltage signal $V_{REF2}'$ that steps down from a high voltage potential level to a low voltage potential level.

Referring now to FIGS. 5A, 5C, 7A, and 7C together, the virtual ground sensing circuitry 500 including the sense circuit 540' may perform a sense operation. Plots 570, 572, and 574 of FIG. 5C corresponding to $V_{BL}$, CTRL2, and $V_{WL}$ are the same for the multi-level polarization scheme. B/L BIAS and W/L BIAS, however, may be selected to apply a critical voltage potential corresponding to a polarization level with a highest magnitude and a positive orientation (e.g., $V_{CR2}$) to a selected ferroelectric memory cell 106. By way of non-limiting example, in a two-bit polarization scheme, the P3 $(+P_{R2})$ polarization level has the highest magnitude and positive polarity (out of P1$(+P_{R1})$, P2$-P_{R1}$), P3 $(+P_{R2})$, and P4 $(-P_{R2})$). Accordingly, B/L BIAS and W/L Bias may be selected to apply the critical voltage potential $V_{CR2}$ (FIGS. 2A and 2B) to the selected ferroelectric memory cell 106.

When the critical voltage potential $V_{CR2}$ is applied to the selected ferroelectric memory cell 106, the selected ferroelectric memory cell 106 may switch to polarization state P3 $(+P_{R2})$, unless the selected ferroelectric memory cell 106 was already in polarization state P3. Accordingly, charge ΔQ may be sinked to the selected ferroelectric memory cell 106 when the critical voltage potential $V_{CR2}$ is applied to the selected ferroelectric memory cell 106 if there is a change in polarization state. The magnitude of the charge ΔQ sinked to the selected ferroelectric memory cell 106 may be different depending on whether the ferroelectric memory cell 106 switches from polarization state P1 to P3 ($\Delta Q_{P1}$), from polarization state P2 to P3 ($\Delta Q_{P2}$), or from polarization state P4 to P3 ($\Delta Q_{P4}$).

As previously discussed with reference to FIG. 5C, a voltage change $\Delta V_{SN2}$ at the sense node SN2 of the sense circuit 540' may change by a factor of $C_{BL}/C_{SN2}$ as compared to a voltage change $\Delta V_{BL}$ on the bit line 102 a result of any charge ΔQ sinked to the selected ferroelectric memory cell 106. The change in voltage $\Delta V_{SN2}$ at the sense node SN2 may be $\Delta Q_{P1}/C_{SN2}$ for a switch from polarization state P1 $(+P_{R1})$ to P3 $(+P_{R2})$, $\Delta Q_{P2}/C_{SN2}$ for a switch from polarization state P2 $(-P_{R1})$ to P3 $(+P_{R2})$, $Q_{P4}/C_{SN2}$ for a switch from polarization state P4 $(-P_{R2})$ to P3 $(+P_{R2})$, and no change if the polarization state stays at P3 $(+P_{R2})$. Plot 770 of FIG. 7B illustrates the change in $V_{SN2}$ that occurs at time t2 (when the critical voltage potential $V_{CR2}$ is applied to the selected ferroelectric memory cell 106) for each of the different polarization states P1, P2, P3, P4 the selected memory cell 106 may have been in when the critical voltage $V_{CR2}$ was applied. As illustrated in the plot 770, switching from polarization state P4 $(-P_{R2})$ to P3$(+P_{R2})$ results in the largest change in $V_{SN2}$. Switching from P2 $(-P_{R1})$ to P3 $(+P_{R2})$ results in less change in $V_{SN2}$. Switching from P1 $(+P_{R1})$ to P3 $(+P_{R2})$ results in still less change in $V_{SN2}$. Of course, staying in P3 $(+P_{R2})$ results in no change in $V_{SN2}$.

After the critical voltage $V_{CR2}$ has been applied to the selected ferroelectric memory cell 106, the digital signal BITS2 may be swept from high to low. As a result, $V_{REF2}'$ may exhibit a stepping pattern, as shown in the plot 770. Each step in the stepping pattern of $V_{REF2}'$ may be associated with a different digital value of BITS2 driving the DAC 610 of FIG. 6A. By way of non-limiting example, a digital 11 may be associated with a first step, a digital 10 may be associated with a second step, a digital 01 may be associated with a third step, and a digital 00 may be associated with a fourth step. As long as the step size of $V_{REF2}'$ is approximately equal to the distance between the different possible voltage levels of $V_{SN2}$ (resulting from the different voltage changes in $V_{SN2}$ when different charges are sinked responsive to changes in polarization states of the selected ferroelectric memory cell 106), the different digital signals (e.g., 00, 01, 10, 11) of BITS2 may also be associated with the different polarization states P1, P2, P3, P4 (e.g., P3 may be associated with 11, P1 may be associated with 10, P2 may be associated with 01, and P3 may be associated with 00).

As illustrated in plot 770, $V_{REF2}'$ may intersect $V_{SN2}$ at time $t_{P3}$ if the selected ferroelectric memory cell 106 was in polarization state P3 $(+P_{R2})$. Also, $V_{REF2}'$ may intersect $V_{SN2}$ at time $t_{P1}$ if the selected ferroelectric memory cell 106 was in polarization state P1 (+$P_{R1}$). Furthermore, $V_{REF2}'$ may intersect $V_{SN2}$ at time $t_{P2}$ if the selected ferroelectric memory cell 106 was in polarization state P2 (-$P_{R1}$). In addition, $V_{REF2}'$ may intersect $V_{SN2}$ at time $t_{P4}$ if the selected ferroelectric memory cell 106 was in polarization state P4 (+$P_{R1}$). As a result, the output DATA2 of the comparator 542', which is configured to compare $V_{REF2}'$ to $V_{SN2}$, toggles from a logic 1 to a logic 0 at different times depending on the polarization state of the selected ferroelectric memory cell 106, as illustrated in plot 780.

When the output DATA2 of the comparator 542' toggles to a logic 0, the latch network 760 may store the digital signal BITS2 asserted at the input of the latch network 760, which is the same as the digital signal BITS2 driving the DAC 750 (and $V_{REF2}'$, by extension). Accordingly, in the example of FIG. 7B, if the polarization state of the selected ferroelectric memory cell 106 was P3 (+$P_{R2}$), the latch network 760 will store a digital 11. Also, if the polarization state was P1 (+$P_{R1}$), the latch network 760 will store a digital 10. If the polarization state was P2 (-$P_{R1}$), the latch network 760 will store a digital 01. If the polarization state was P4 (-$P_{R2}$), the latch network 760 will store a digital 00. Thus, by applying the critical voltage $V_{CR2}$, sweeping the digital signal BITS2, and reading data stored by the latch network 760, it may be determined what polarization state P1, P2, P3, P4 the selected ferroelectric memory cell 106 was in.

Of course, this sense operation switches the selected ferroelectric memory cell 106 to polarization state P3 (+$P_{R2}$) regardless of the polarization state the selected ferroelectric memory cell 106 was in before. Accordingly, if it is desired to preserve the data that was stored in the selected ferroelectric memory cell 106, the sensed polarization state associated with the digital signal 00, 01, 10, 11 may be re-applied to the selected ferroelectric memory cell 106 by applying the corresponding critical voltage $V_{CR1}$, -$V_{CR1}$, $V_{CR2}$, -$V_{CR2}$.

Figure 8:
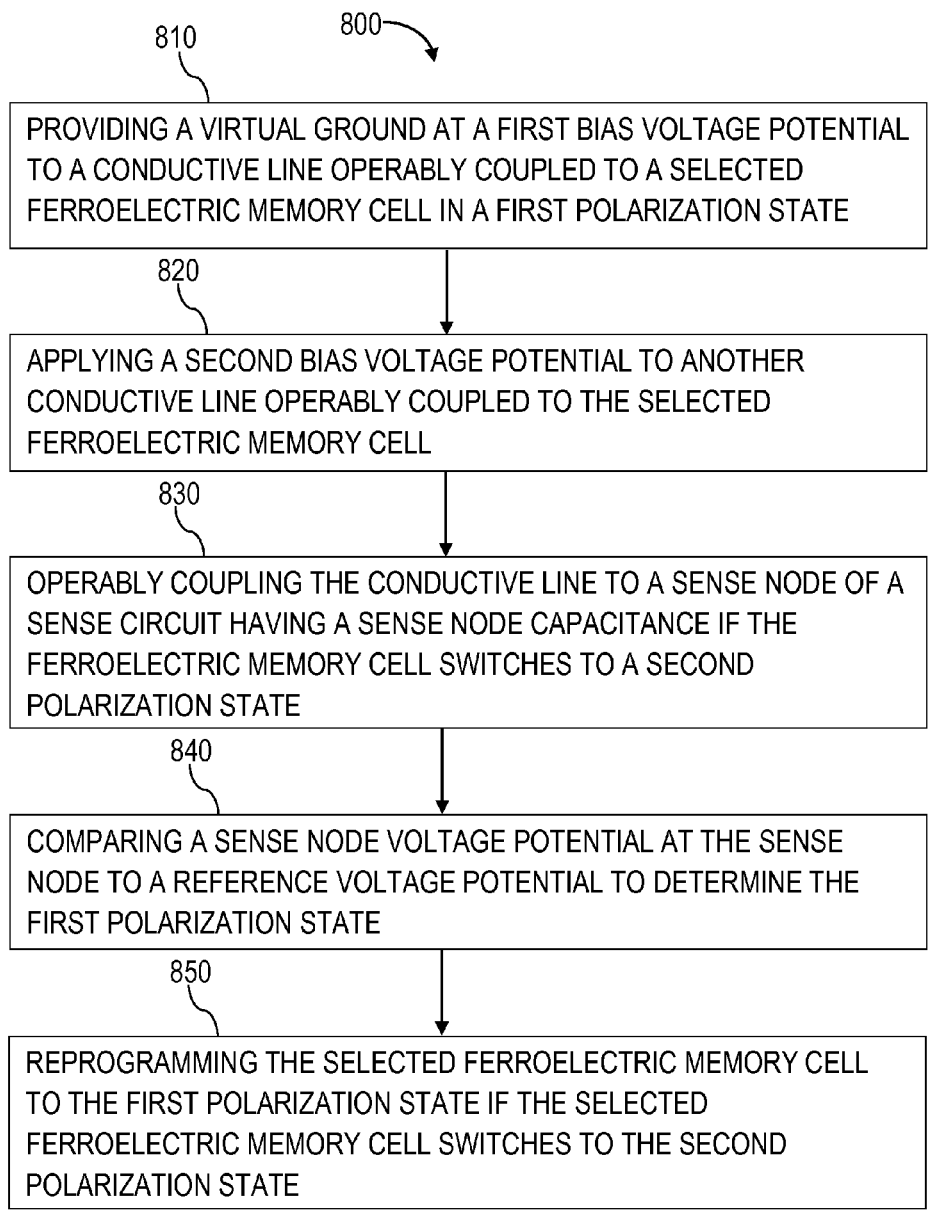
FIG. 8 is a simplified flowchart illustrating a method of performing a sense operation of a selected ferroelectric memory cell.

FIG. 8 is a simplified flowchart 800 of a method of performing a sense operation of a selected ferroelectric memory cell 106. Referring to FIGS. 4, 5A, 6A, 7A, and 8 together, at operation 810, the method may include providing a virtual ground at a first bias voltage potential (e.g., B/L BIAS) to a conductive line (e.g., bit line 102, word line 104) operably coupled to a selected ferroelectric memory cell 106 at a polarization state (e.g., one of P1, P2, P3, P4, etc., corresponding to respective polarization levels +$P_{R1}$, -$P_{R1}$, +$P_{R2}$, -$P_{R2}$, etc.).

At operation 820, the method may include applying a second bias voltage potential (e.g., W/L BIAS) to another conductive line (e.g., the other of bit line 102 and word line 104) operably coupled to the selected ferroelectric memory cell 106. The first bias voltage potential and the second bias voltage potential may be selected to apply a critical voltage potential $V_{CR1}$, -$V_{CR1}$, $V_{CR2}$, -$V_{CR2}$, etc., to the selected ferroelectric memory cell 106.

At operation 830, the method may include operably coupling the conductive line (e.g., 102, 104) to a sense node SN1, SN2 of a sense circuit 540, 540', 550, 550' having a sense node capacitance $C_{SN1}$, $C_{S2}$ if the selected ferroelectric memory cell 106 switches to another polarization state P1, P2, P3, P4 (corresponding respectively to polarization levels +$P_{R1}$, -$P_{R1}$, +$P_{R2}$, -$P_{R2}$).

At operation 840, the method may include comparing a voltage potential $V_{SN1}$, $V_{SN2}$ at the sense node SN1, SN2 to a reference voltage potential $V_{REF1}$, $V_{REF1}'$, $V_{REF2}$, $V_{REF2}'$ to determine the polarization state of the selected ferroelectric memory cell 106.

At operation 850, the method may include reprogramming the selected ferroelectric memory cell 106 to the polarization state if the selected ferroelectric memory cell 106 switches to the another polarization state.

In some embodiments, a method includes providing a virtual ground at a first bias voltage potential to a conductive line operably coupled to a selected ferroelectric memory cell in a first polarization state. The method also includes applying a bias voltage potential to another conductive line operably coupled to the selected ferroelectric memory cell. The first bias voltage potential and the second bias voltage potential are selected to apply a critical voltage to the selected ferroelectric memory cell. The method also includes operably coupling the conductive line to a sense node of a sense circuit having a sense node capacitance if the ferroelectric memory cell switches to a second polarization state. The method further includes comparing a sense node voltage potential at the sense node to a reference voltage potential to determine the first polarization state. In some embodiments, the method includes storing data corresponding to the determined first polarization state in a latch, and resetting the selected ferroelectric memory cell to the first polarization state after the sense operation is performed. In some embodiments, the method includes sweeping the reference voltage potential from the low voltage potential to the high voltage potential during the sense operation. In some embodiments, sweeping the reference voltage potential from the low voltage potential to the high voltage potential includes sweeping the reference voltage potential in a stepping pattern from the low voltage potential to a high voltage potential. In some embodiments, sweeping the reference voltage potential from the low voltage potential to the high voltage potential includes sweeping the reference voltage potential linearly from the low voltage potential to the high voltage potential.

In some embodiments, a method of operating an electrical system includes applying, with biasing circuitry, a critical voltage potential to a selected ferroelectric memory cell in an array of ferroelectric memory cells through a pair of conductive lines operably coupled to the selected ferroelectric memory cell. The critical voltage potential is selected to cause the selected ferroelectric memory cell to switch from a first polarization state to a second polarization state. The method also includes discharging, with virtual ground sensing circuitry operably coupled to one of the pair of conductive lines, charge that is at least one of sinked to and emitted from the selected ferroelectric memory cell to a sense node if the selected ferroelectric memory cell switches from the first polarization state to the second polarization state. The sense node has a sense node capacitance that is less than a capacitance of the one of the pair of conductive lines. In some embodiments, the method may further comprise determining that the selected ferroelectric memory cell was in the first polarization state responsive to detecting the charge that is discharged to the sense node. In some embodiments, the method may further include determining that the selected ferroelectric memory cell was in the second polarization state responsive to detecting zero change in charge at the sense node. In some embodiments, the method may further include determining that the selected ferroelectric memory cell was in a third polarization state different from the first polarization state and the second polarization state responsive to detecting a different charge that is discharged to the sense node.

Figure 9:
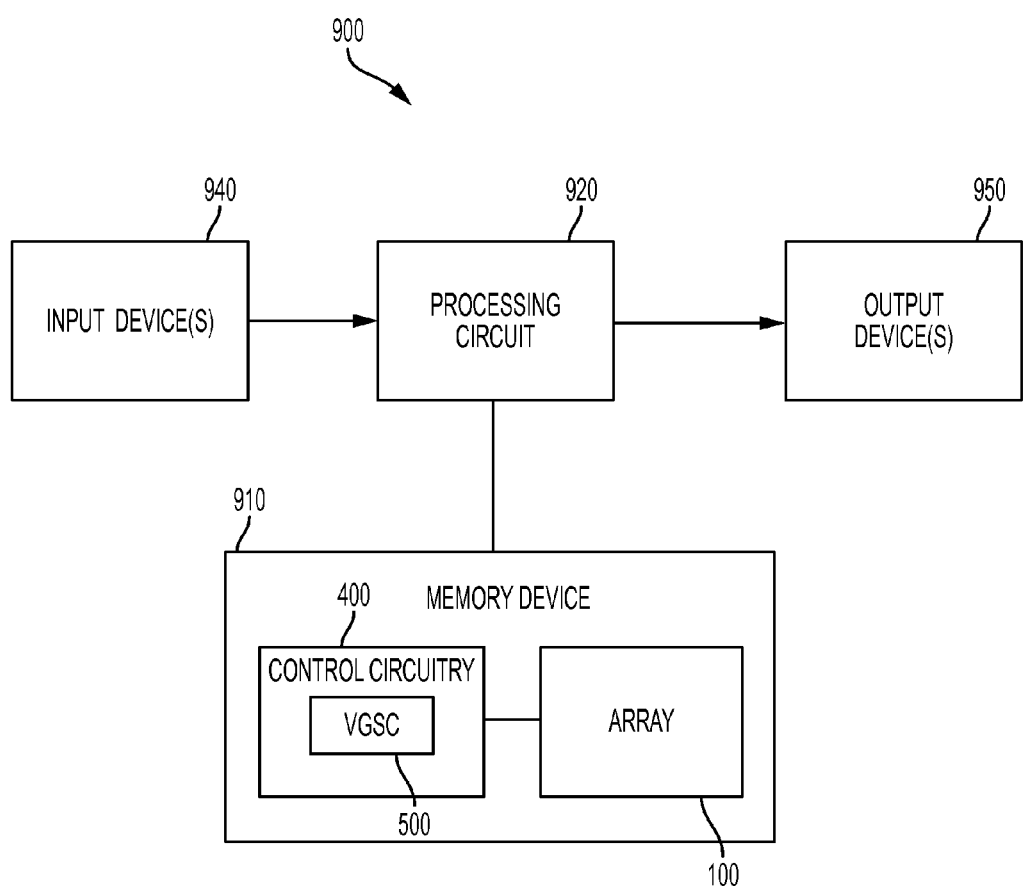
FIG. 9 is a simplified block diagram of a computing device including a memory device that includes the control circuitry of FIG. 4.

FIG. 9 is a simplified block diagram of a computing device 900 including a memory device 910 that includes the control circuitry 400 of FIG. 4. The computing device 900 may include a processing circuit 920 operably coupled to the memory device 910, one or more input devices 940 and one or more output devices 950. The memory device 910 may include an array 100 of memory cells (e.g., the ferroelectric memory cells 106 of FIG. 1) operably coupled to the control circuitry 400. The control circuitry 400 may include the virtual ground sensing circuitry (VGSC) 500, as previously discussed herein. The processing circuit 920 may be configured to execute computer-readable instructions stored in the array 100.

The input devices 940 may include a keyboard, a mouse, a track pad, a microphone, a touch-screen, other input devices, and combinations thereof. The output devices 950 may include an electronic display (e.g., a touch screen), an acoustic transducer, light emitting diodes, other output devices, and combinations thereof. The input device 940 and the output devices may be configured to enable a user of the computing device 900 to interact with the computing device.

In some embodiments, a computing device includes a memory device. The memory device includes an array of ferroelectric memory cells, and control circuitry including a virtual ground sensing circuit. The virtual ground sensing circuit is configured to operably couple to the ferroelectric memory cells of the array of ferroelectric memory cells. The virtual ground sensing circuit is configured to provide a virtual ground to a conductive line operably coupled to a selected ferroelectric memory cell, and selectively discharge the conductive line to a sense node of a sense circuit responsive to the selected ferroelectric memory cell switching from a first polarization state to a second polarization state. The sense node has a sense node capacitance less than a capacitance of the conductive line. The computing device also includes a processing circuit operably coupled to the memory device. The processing circuit is configured to execute computer-readable instructions stored in the array of the memory device. In some embodiments, the computing device includes at least one input device and at least one output device operably coupled to the processing circuit. The at least one input device and the at least one output device are configured to enable a user of the computing device to interact with the computing device.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed by the disclosure.

What is claimed is:

1. A method of performing a sense operation for a selected ferroelectric memory cell, the method comprising:
    providing a virtual ground at a first bias voltage potential to a conductive line operably coupled to the selected ferroelectric memory cell in a first polarization state;
    applying a second bias voltage potential to another conductive line operably coupled to the selected ferroelectric memory cell, wherein the first bias voltage potential and the second bias voltage potential are selected to apply a critical voltage to the selected ferroelectric memory cell;
    operably coupling the conductive line to a sense node of a sense circuit having a sense node capacitance if the ferroelectric memory cell switches to a second polarization state; and
    comparing a sense node voltage potential at the sense node to a reference voltage potential to determine the first polarization state.

2. A method of performing a sense operation for a selected ferroelectric memory cell, the method comprising:
    providing a virtual ground at a first bias voltage potential to a conductive line operably coupled to the selected ferroelectric memory cell in a first polarization state;
    applying a second bias voltage potential to another conductive line operably coupled to the selected ferroelectric memory cell, wherein the first bias voltage potential and the second bias voltage potential are selected to apply a critical voltage to the selected ferroelectric memory cell;
    operably coupling the conductive line to a sense node of a sense circuit having a sense node capacitance if the ferroelectric memory cell switches to a second polarization state;
    comparing a sense node voltage potential at the sense node to a reference voltage potential to determine the first polarization state; and
    storing data corresponding to the determined first polarization state in a latch, and resetting the selected ferroelectric memory cell to the first polarization state after the sense operation is performed.

3. The method of claim 1, further comprising sweeping the reference voltage potential from a low voltage potential to a high voltage potential during the sense operation.

4. The method of claim 3, wherein sweeping the reference voltage potential from the low voltage potential to the high voltage potential comprises sweeping the reference voltage potential in a stepping pattern from the low voltage potential to a high voltage potential.

5. The method of claim 3, wherein sweeping the reference voltage potential from the low voltage potential to the high voltage potential comprises sweeping the reference voltage potential linearly from the low voltage potential to the high voltage potential.

6. The method of claim 1, wherein comparing the sense node voltage potential to the reference voltage comprises comparing the sense node voltage potential to a plurality of different reference voltage potentials to determine the first polarization state.

7. An electrical system, comprising:
    an array of memory cells, each memory cell in the array of memory cells including a first electrode and a second electrode and configured to transition from a first data state to a second data state when a critical voltage potential is applied across the first electrode and the second electrode; and
    control circuitry operably coupled to the array of memory cells, the control circuitry including:
        biasing circuitry configured to apply the critical voltage potential to a selected memory cell of the array of memory cells by providing a first bias voltage potential to the first electrode of the selected memory cell and a second bias voltage potential to the second electrode of the selected memory cell; and
        a virtual ground sensing circuit operably coupled between the biasing circuitry and the second electrode, the virtual ground sensing circuitry configured to:

relay the second bias voltage potential from the biasing circuitry to the second electrode;

serve as a virtual ground operably coupled to the second electrode;

selectively discharge the second electrode to a first sense node if the memory cell transitions from the first data state to the second data state; and compare a sense node voltage potential of the first sense node to a reference voltage potential to determine a data state the selected memory cell was in.

8. The electrical system of claim 7, wherein at least a portion of the memory cells in the array of memory cells includes a ferroelectric material between the first electrode and the second electrode.

9. The electrical system of claim 8, wherein the ferroelectric material comprises at least one material selected from the group consisting of lead zirconate titanate (PZT), strontium bismuth tantalite (SBT), bismuth lanthanum titanate (BLT), lead titanate, and barium titanate.

10. The electrical system of claim 7, wherein the virtual ground sensing circuit comprises:

an operational amplifier having a non-inverting input configured to receive the second bias voltage potential;

a follower circuit including an n-MOS transistor and a p-MOS transistor, wherein:

a source of the n-MOS transistor is operably coupled to each of a source of the p-MOS transistor, an inverting input of the operational amplifier, and the second electrode of the memory cell;

a drain of the n-MOS transistor is operably coupled to a high voltage potential power supply;

a drain of the p-MOS transistor is capacitively coupled to a low voltage potential power supply; and a gate of the n-MOS transistor and a gate of the p-MOS transistor are both operably coupled to an output of the operational amplifier; and a comparator configured to compare a drain voltage potential of the drain of the p-MOS transistor to a reference voltage potential.

11. The electrical system of claim 10, wherein the drain of the p-MOS transistor is capacitively coupled to the low-voltage potential power supply through a parasitic capacitance.

12. The electrical system of claim 10, wherein the control circuitry further comprises a bit line decoder configured to selectively operably couple the source of the n-MOS transistor to the second electrode of the memory cell.

13. The electrical system of claim 7, wherein the virtual ground sensing circuit is further configured to:

discharge the second electrode to a second sense node if the memory cell transitions from the second state to the first state; and compare a sense node voltage potential of the second sense node to a reference voltage potential to determine a data state the selected memory cell was in.

14. A virtual ground sensing circuit, comprising:

at least one sense circuit configured to compare a reference voltage potential to a sense node voltage potential of a first sense node of the at least one sense circuit, the first sense node having a sense node capacitance;

virtual ground circuitry operably coupled to the at least one sense circuit and configured to:

provide a virtual ground at a first bias voltage potential to a conductive line operably coupled to a selected ferroelectric memory cell; and selectively discharge the conductive line to the first sense node of the at least one sense circuit responsive to the selected ferroelectric memory cell changing from a first polarization state to a second polarization state.

15. The virtual ground sensing circuit of claim 14, wherein the at least one sense circuit includes a transistor configured to selectively operably couple the first sense node to a power voltage potential.

16. The virtual ground sensing circuit of claim 15, wherein the transistor is configured to isolate the first sense node from the power voltage potential during a sense operation of the selected ferroelectric memory cell.

17. The virtual ground sensing circuit of claim 14, wherein the at least one sense circuit is configured to detect charge emitted by the selected ferroelectric memory cell when the selected ferroelectric memory cell changes from the first polarization state to the second polarization state.

18. The virtual ground sensing circuit of claim 14, wherein the at least one sense circuit is configured to detect charge sunk to the selected ferroelectric memory cell if the selected ferroelectric memory cell changes from the first polarization state to the second polarization state.

19. The virtual ground sensing circuit of claim 14, wherein the first polarization state and the second polarization state correspond to data states in a one-bit single-level polarization scheme.

20. The virtual ground sensing circuit of claim 19, wherein the first polarization state corresponds to one of a digital logic "1" and a digital logic "0", and the second polarization state corresponds to the other of the digital logic "1" and the digital logic "0".

21. The virtual ground sensing circuit of claim 14, wherein the first polarization state and the second polarization state correspond to data states in a multi-bit multi-level polarization scheme.

22. The virtual ground sensing circuit of claim 21, wherein the first polarization state and the second polarization state correspond to data states in a two-bit multi-level polarization scheme.

23. The virtual ground sensing circuit of claim 14, wherein the first sense node capacitance is less than a capacitance of the conductive line.

24. The virtual ground sensing circuit of claim 14, wherein the first sense node capacitance comprises a parasitic capacitance.

25. The virtual ground sensing circuit of claim 14, wherein the virtual ground circuitry is further configured to:

selectively discharge the conductive line to a second sense node responsive to the selected ferroelectric memory cell changing from a second polarization state to a first polarization state; and compare a sense node voltage potential of the second sense node to a reference voltage potential to determine a data state the selected memory cell was in.

* * * * *

UNITED STATES PATENT AND TRADEMARK OFFICE
CERTIFICATE OF CORRECTION

PATENT NO. : 9,786,346 B2  
APPLICATION NO. : 14/717471  
DATED : October 10, 2017  
INVENTOR(S) : Giulio Giuseppe Marotta and Marco Domenico Tiburzi Page 1 of 1

It is certified that error appears in the above-identified patent and that said Letters Patent is hereby corrected as shown below:

In the Specification

| | | |
|---|---|---|
| Column 8, | Line 16, | change "($pC/cm^2$)." to --($\mu C/cm^2$).-- |
| Column 17, | Lines 24-25, | change "to therefore to increase" to --to increase-- |
| Column 17, | Line 47, | change "$V_{IN}$ of transistor Q1," to --$V_{TN}$ of transistor Q1,-- |
| Column 18, | Lines 59-60, | change "critical voltage $V_{CR}$, across" to --critical voltage $V_{CR1}$, across-- |
| Column 19, | Lines 61-62, | change "power supply $V_{ss}$." to --power supply $V_{SS}$-- |
| Column 21, | Line 25, | change "$Q_{P3}/C_{SN1}$ for" to --$\Delta Q_{P3}/C_{SN1}$ for-- |
| Column 24, | Line 30, | change "$Q_{P4}/C_{SN2}$ for" to --$\Delta Q_{P4}/C_{SN2}$ for-- |
| Column 25, | Lines 42-43, | change "(e.g., B/L BIAS)" to --(e.g., B/L BIAS')-- |
| Column 25, | Line 59, | change "$C_{S2}$ if the" to --$C_{SN2}$ if the-- |

Signed and Sealed this  
Thirteenth Day of March, 2018

Andrei Iancu  
*Director of the United States Patent and Trademark Office*